US007960758B2

(12) United States Patent
Maeda

(10) Patent No.: US 7,960,758 B2
(45) Date of Patent: Jun. 14, 2011

(54) BIPOLAR TRANSISTOR AND RADIO FREQUENCY AMPLIFIER CIRCUIT

(75) Inventor: Masahiro Maeda, Osaka (JP)

(73) Assignee: Panasonic Corporation, Osaka (JP)

( * ) Notice: Subject to any disclaimer, the term of this patent is extended or adjusted under 35 U.S.C. 154(b) by 934 days.

(21) Appl. No.: 11/395,129

(22) Filed: Apr. 3, 2006

(65) Prior Publication Data

US 2006/0223484 A1 Oct. 5, 2006

(30) Foreign Application Priority Data

Apr. 5, 2005 (JP) ................................ 2005-108375

(51) Int. Cl.
*H01L 29/66* (2006.01)

(52) U.S. Cl. . 257/197; 257/198; 257/511; 257/E29.188; 438/170; 438/189; 438/202

(58) Field of Classification Search .................. 257/197, 257/198, 47, 205, 273, 351, 361–387, 423–428, 257/474–480, 511–545, 565–593; 438/479, 438/481, 170, 189, 202–205, 234–237, 309–340
See application file for complete search history.

(56) References Cited

U.S. PATENT DOCUMENTS 3,984,761 A * 10/1976 Edington et al. .............. 323/274
5,321,279 A 6/1994 Khatibzadeh et al.
5,629,648 A 5/1997 Pratt
6,661,290 B2 * 12/2003 Sugiura ......................... 330/289
6,828,816 B2 12/2004 Ham
7,057,443 B2 * 6/2006 Nakamura .................... 327/540
7,227,418 B2 * 6/2007 Makioka ....................... 330/295
2003/0199153 A1 * 10/2003 Kovacic et al. ............... 438/479
2004/0000676 A1 * 1/2004 Fujioka et al. ................ 257/198
2004/0041235 A1 * 3/2004 Yanagihara et al. .......... 257/565
2004/0183159 A1 * 9/2004 Tamaki et al. ................ 257/577
2005/0030101 A1 * 2/2005 Ichitsuho et al. ............. 330/285

FOREIGN PATENT DOCUMENTS

JP 11-251584 9/1999
JP 2000-306919 11/2000
JP 2002076016 * 3/2002
JP 2002-151520 5/2002

OTHER PUBLICATIONS

Japanese Office Action issued in Japanese Patent Application No. JP 2006-086256 dated Dec. 8, 2009.

* cited by examiner

*Primary Examiner* — Thanh V Pham
*Assistant Examiner* — Mark A Laurenzi, III
(74) *Attorney, Agent, or Firm* — McDermott Will & Emery LLP

(57) ABSTRACT

A bipolar transistor and a radio frequency amplifier circuit capable of preventing thermal runaway in the bipolar transistor without affecting the radio frequency amplifier circuit, which includes: a direct-current (DC) bias terminal to which a DC bias is supplied; a DC base electrode connected to the DC terminal; a radio frequency (RF) power terminal to which a radio frequency signal is supplied; an RF base electrode connected to the RF terminal; and a base layer connected to the DC base electrode and the RF base electrode.

5 Claims, 14 Drawing Sheets

5 3 DC 2 RF 4 5
61 16
6 11 7 8
12 12
P 62 Q 23 R
60

FIG. 1A
FIG. 1B
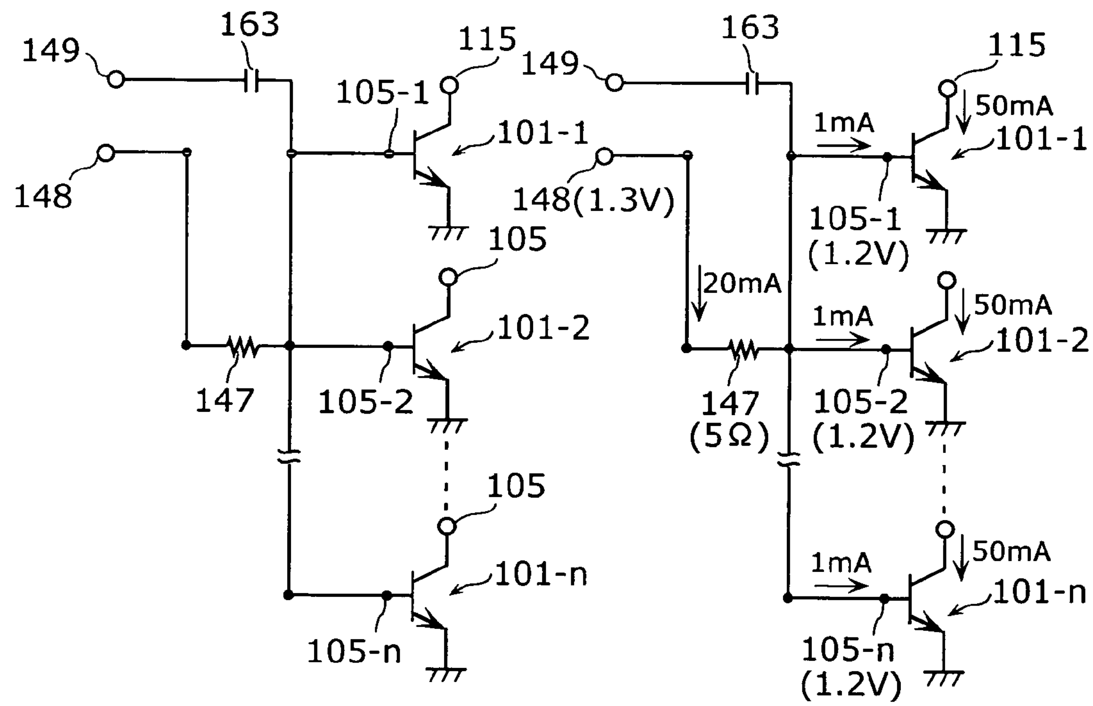
FIG. 2
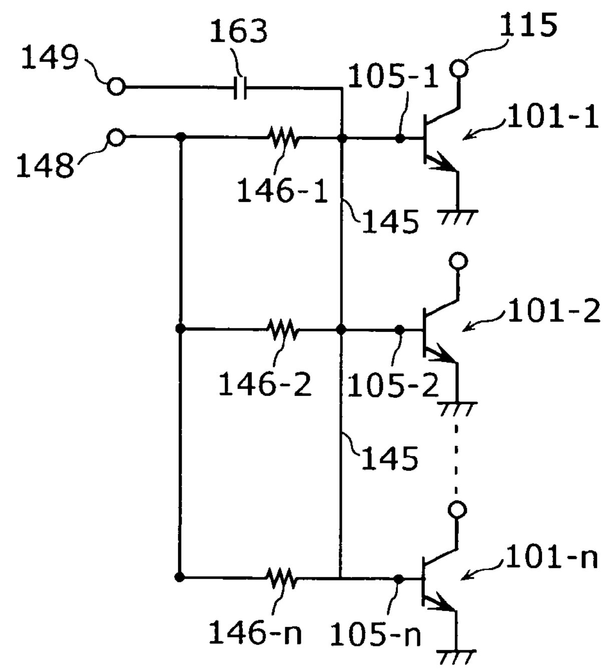

5
AF-2
402
7-2
2
6
3
DC
2
RF-1
401
7-1
5
12
79

BIPOLAR TRANSISTOR AND RADIO FREQUENCY AMPLIFIER CIRCUIT

BACKGROUND OF THE INVENTION (1) Field of the Invention

The present invention relates to a semiconductor device, and in particular, to a bipolar transistor and a radio frequency amplifier circuit equipped with a bipolar transistor.

(2) Description of the Related Art

At present, a GaAs-MESFET (Metal Semiconductor Field Effect Transistor), GaAs-HEMT (High Electron Mobility Transistor), a hetero-junction bipolar transistor (HBT) or the like are used as an amplifier element for a power amplifier for mobile communication. A hetero-junction bipolar transistor (hereinafter to be referred to as "HBT"), in particular, is advantageous over a GaAs-MESFET in the two following points. First, an HBT does not require a negative power supply and thereby enables single positive power supply operation, and second, it is possible to miniaturize the chip size since collector current density can be increased.

It is generally known that the amount of collector current increases as ON voltage of a base-emitter voltage (hereinafter base-emitter voltage is denoted as "Vbe" and ON voltage between a base and an emitter is denoted as "Vf") decreases when an element temperature rises. Therefore, when concentration of collector current is caused in a radio frequency power amplifier equipped with plural transistors, the amplifier falls into a vicious circle in which the element temperature rises locally due to the increase in power consumption, which further increases locally the collector current in the element. Thus, uneven amount of current between the transistors does not only affect performance and life span of a power amplifier, but also promotes the concentration of current, so that the transistor falls into the thermal runaway state and breaks down in some cases.

As a solution to such problem as described above, a base ballast resistor, which is connected to the base of a bipolar transistor and gives a negative feedback to the base-emitter voltage (Vbe) when the element temperature rises, has conventionally been used. With such negative feedback to Vbe, it is possible to balance out the increase in the amount of collector current due to the rise in temperature, and prevent thermal runaway. The following describes the conventional technology of the radio frequency amplifier circuit to which the conventional base ballast resistor is applied.

FIG. 1A is an equivalent circuit schematic of a conventional radio frequency amplifier circuit. Bipolar transistors 101-1, 101-2 and 101-*n* (to be represented as "101" hereinafter) are bipolar transistors of n number of cells. A collector voltage is applied to a collector terminal 115 while an emitter terminal is earthed. A direct-current (DC) bias is provided from a DC terminal 148, and a radio frequency (RF) power is inputted from an RF terminal 149. The DC terminal 148 is connected to base electrodes 105-1, 105-2 and 105-*n* (hereinafter to be represented as "105") of the bipolar transistor 101 via a resistance 147 as a base ballast resistor. The RF terminal 149 is connected to the base electrode 105 of the bipolar transistor 101 via a condenser 163. The radio frequency power amplified by the bipolar transistor 101 is outputted from the collector terminal 115.

FIG. 1B shows voltage values and current values at the respective terminals shown in FIG. 1A. It is assumed that a current amplification factor (hFE) of the bipolar transistor 101 is 50, the number of cells is defined as n=20, and a resistance value indicated by the resistance 147 is 5 ohms. In the case where a total amount of the collector current is 1 A and the amount of current is evenly distributed to the bipolar transistors 101, a collector current is 50 mA and a base current is 1 mA for each bipolar transistor 101. The total amount of base current is 20 mA and a voltage drop generated in the resistance 147 is 0.1V. Therefore, when 1.3V is applied to the DC terminal 148, 1.2V is applied to the base electrode 105.

In FIGS. 1A and 1B, the case where current concentration occurs in an arbitrary bipolar transistor is taken as an example. For instance, it is assumed that a collector current of 60 mA that is 1.2 times as much as a collector current of another bipolar transistor 101-*n* flows in the bipolar transistor 101-2. In this case, since a current amplification factor of the bipolar transistor 101-1 is 50, the base current that flows in the resistance 147 increases from 1 mA to 1.2 mA, and the base current that flows in the resistance 147 increases from 20 mA to 20.2 mA. Due to the increase by 0.2 mA in the base current, the negative feedback of Vbe generated in the resistance 147 is 1 mV at the highest. Due to the increase in the amount of current, however, a junction temperature of the bipolar transistor 101-2 rises from the initial temperature of 80 to 90 degrees Celsius. Such temperature increase by 10 degrees Celsius reduces the ON voltage (Vf) of Vbe by 0.017V. Thus, the negative feedback (1 mV) of Vbe generated in the resistance 147 is smaller than the decrease (17 mV) of Vf due to the increase in temperature so that the amount of collector current continues to increase. More precisely, Vf decreases by 17 mV and the negative feedback of Vbe is 1 mV, and as a result, the total decrease of Vf is 16 mV and the amount of the current which flows in the bipolar transistor 101-2 increases by 60% and thus amounts to 80 mA. Indeed, the amount of negative feedback of Vbe to be obtained increases as the resistance value of the resistance 147 is increased, however, such increase in resistance is not appropriate in this case since it increases the voltage drop in the resistance 147 even in normal operation and the necessary voltage applied to the DC terminal 148 becomes large.

As has been described, the problem of the conventional radio frequency amplifier circuit in FIGS. 1A and 1B is that the negative feedback voltage of Vbe to be obtained in the resistance 147 is not sufficient enough to balance out the decrease of Vf due to the increase in the amount of collector current, therefore, thermal runaway in bipolar transistor cannot be prevented in the case where the amount of collector current of an arbitrary bipolar transistor increases by 20%.

FIG. 2 is an equivalent circuit schematic of another conventional radio frequency amplifier circuit (see specification of U.S. Pat. No. 6,828,816).

The difference between the present radio frequency amplifier circuit and the conventional radio frequency amplifier circuit in FIGS. 1A and 1B is that resistances 146-1, 146-2 and 146-*n* (hereinafter to be represented by 146) as base ballast resistors are each connected between the DC terminal 148 and the respective base electrodes 105. In the case where the number of cells in the bipolar transistor 101 is defined as n=20, in order to set a value of parallel resistance of the resistance 146 connected between the DC terminal 148 and the base electrode 105 to be 5 ohms, a resistance value of the respective resistances 146 needs to be set to 100 ohms.

As shown in FIG. 2, the resistance 146 is set to each bipolar transistor 101 so that it appears that the negative feedback of Vbe can be increased due to the resistance 146, however, it is hard to say that the effects are sufficiently gained. The reason is that the base electrode 105 of the bipolar transistor 101 is connected to a wiring 145 for transmitting radio frequency. Due to this, in the case where the amount of current in an arbitrary bipolar transistor (e.g. 101-2) increases, the base current which increases accordingly is provided not only through the resistance 146-2 but also from other resistance **146-*n* via the wiring 145. Such phenomenon can be understood from the point that the base electrode 105-2 and another base electrode 105-*n*** come to have the same potential within one circuit.

As is described above, the problem of the conventional radio frequency amplifier circuit shown in FIG. 2 is that the circuit shown in FIG. 2 is substantially the same as the circuit shown in FIGS. 1A and 1B, and the amount of the negative feedback voltage of Vbe to be obtained in the resistance 146 is the same as that obtained with the conventional radio frequency amplifier circuits shown in FIGS. 1A and 1B, and is still not enough to prevent thermal runaway caused in bipolar transistor.

FIG. 3 is an equivalent circuit schematic of another conventional radio frequency amplifier circuit (see specification of U.S. Pat. No. 5,321,279).

The difference between the present radio frequency amplifier circuit and the conventional radio frequency amplifier circuit shown in FIG. 2 is that condensers 150-1, 150-2 and **150-*n* (hereinafter to be represented as "150") are parallely connected to the respective resistances 146-1, 146-2 and 146-*n*. Ideally, radio frequency power is inputted from the base electrode 105 to the bipolar transistor 101 through the condenser 150. In contrast, a direct-current bias is provided from the base electrode 105 to the bipolar transistor 101 through the resistance 146. It is necessary that a relatively large capacity value is set for the condenser 150 so that a loss of radio frequency is reduced. In the case of setting the number of cells in the bipolar transistor 101 as n=20 and a resistance value of the resistance 146 to be 100 ohms, a value of parallel resistance of the resistance 146** is 5 ohms.

According to the present radio frequency amplifier circuit, it is assumed that the collector current of 60 mA, an equivalent of 1.2 times as much as the collector current of another bipolar transistor **101-*n* flows in the bipolar transistor 101-2, as is the case of the conventional radio frequency amplifier circuit shown in FIGS. 1A and 1B. Since hFE of the bipolar transistor 101-1 is 50, the base current that flows in the resistance 146-2 increases from 1 mA to 1.2 mA. The resistance 146 being 100 ohms, the negative feedback voltage of Vbe to be generated in the resistance 146 is 20 mV. Due to the increase in the amount of current, a junction temperature of the bipolar transistor 101-2 rises from the initial temperature of 80 to 90 degrees Celsius, and the decrease of ON voltage (Vf) of Vbe due to such temperature increase (10 degrees Celsius) becomes 17 mV. In this case, the negative feedback (20 mV) of Vbe generated in the resistance 146** is larger than the decrease (17 mV) of Vf due to the temperature increase, so that the amount of collector current starts to decease. Thus, with the present radio frequency amplifier circuit, it is possible to balance out the increase in the amount of collector current, by the negative feedback of Vbe, and thereby to prevent the occurrence of thermal runaway.

The problem with the conventional radio frequency amplifier circuit shown in FIG. 3 is that the gain decreases. The reason is that a part of the radio frequency power inputted from the RF terminal 149 is consumed as heat when passing through the resistance 146.

FIG. 4 is another equivalent circuit schematic of the conventional radio frequency amplifier circuit (see U.S. Pat. No. 5,629,648).

The difference between the present radio frequency amplifier circuit and the conventional radio frequency amplifier circuit shown in FIG. 3 is that the radio frequency power inputted from the RF terminal 149 is inputted into the base electrode 105 without passing through the resistance 146. Thus, it is possible to avoid decrease of gain.

Nevertheless, the problem of the conventional radio frequency amplifier circuit shown in FIG. 4 is that each bipolar transistor 101 needs to be equipped with a condenser 150 for letting radio frequency power pass, therefore, the layout becomes complex and the cost of radio frequency amplifier circuit increases due to increase in the chip area.

Another problem with the conventional radio frequency amplifier circuit shown in FIG. 4 is that a mixed flow of radio frequency power and direct-current bias at the terminals 152-1, 152-2 and **152-*n* (hereinafter to be represented as "152") causes the radio frequency power to easily leak to the direct-current bias terminal 148 and thereby affects a bias circuit (not shown in the diagram) for providing the direct-current bias terminal 148 with bias. In order to solve this, a ground condenser needs to be connected to the DC terminal 148**, which causes another problem that the number of components increases.

FIG. 5A is a cross-sectional view showing the structure of the bipolar transistor 101 in the conventional radio frequency amplifier circuit. FIG. 5B is a plane view of the conventional bipolar transistor 101, and FIG. 5A shows a cross-sectional view of such transistor at the dashed line A-A'. However, in FIG. 5A, an emitter wiring 132 is omitted. As shown in FIG. 5A, on a substrate 118 made of GaAs, a collector contact layer 117 made of $n^+$-type GaAs, a collector layer 109 made of n-type GaAs, a base layer 108 bade of p-type GaAs, an emitter layer 111 made of n-type InGaP, and an emitter contact layer 110 made of n-type InGaAs are sequentially formed. An emitter electrode 113 is formed on the emitter contact layer 110, while a collector electrode 112 is formed on the collector contact layer 117 and a base electrode 107 is formed on the base layer 108. The p-type GaAs forming the base layer 108 has an impurity density of $4\times10^{19}$ $cm^{-3}$, a thickness of 80 nm, and a sheet resistor of 250 ohms/sq. In FIG. 5B, the emitter electrode 113 is pulled out while connected to the emitter wiring 132, and is connected to the emitter terminal 102. A signal generated by synthesizing DC and RF is provided from the terminal 103 to the base electrode 107. In order to improve radio frequency characteristic, it is necessary to reduce the base-emitter resistance 122 and thereby to make the gap 119 between the base electrode 107 and the emitter layer 111 shorter. Thus, when the gap 119 is becomes bigger, the base-emitter resistance 122 gets larger so that it is possible to increase a negative feedback voltage of Vbe, however, a loss of radio frequency power increases and the radio frequency characteristic is degraded.

Thus, the problem of the conventional bipolar transistor 101 shown in FIGS. 5A and 5B is that it is not possible to increase the negative feedback voltage of Vbe since the base-emitter resistance 122 needs to be reduced in order to improve radio frequency characteristic because the base electrode 107 is provided with the signal generated by synthesizing DC and RF.

FIG. 6 is a cross-sectional showing the structure of another bipolar transistor in the conventional radio frequency amplifier circuit. The difference between the present bipolar transistor and the bipolar transistor 101 shown in FIGS. 5A and 5B is that two mesa-shaped emitter layers 111 and three base electrodes 107 are formed on the base layer 108. A bipolar transistor having plural emitter layers is generally called "multi-finger type bipolar transistor". It is necessary, even in a multi-finger bipolar transistor, to reduce a base-emitter resistance 122 in order to enhance the radio frequency characteristic, so that gaps 119-1 through 119-4 between the respective base electrodes 107 and the respective emitter layers 111 need to become closer. The base-emitter gaps 119-1 through 119-4 are designed to have the same length.

SUMMARY OF THE INVENTION

The problem of the conventional radio frequency amplifier circuit shown in FIGS. 1A and 1B is that the amount of the negative feedback voltage of Vbe obtained in the resistance 147 is not sufficient enough to balance out the decrease of Vf due to the increase in the amount of collector current, so that in the case where the amount of collector current of an arbitrary bipolar transistor increases by 20%, for instance, it is not possible to prevent thermal runaway in the bipolar transistor.

The problem is that the circuit shown in FIG. 2 is substantially the same as the circuit shown in FIGS. 1A and 1B, and the amount of the negative feedback voltage of Vbe to be obtained in the resistance 146 is the same as the one obtained with the conventional radio frequency amplifier circuit in FIGS. 1A and 1B, and is still not enough to prevent thermal runaway in bipolar transistor.

The problem of the conventional radio frequency amplifier circuit shown in FIG. 3 is that the gain decreases. The reason is that a part of the radio frequency voltage inputted from the RF terminal 149 is consumed as heat when passing through the resistance 146.

The problem of the conventional radio frequency amplifier circuit shown in FIG. 4 is that a condenser 151 for letting a radio frequency voltage pass is required in each of the bipolar transistors, which complicates the layout. This increases the chip area, which causes the circuit to be costly.

Another problem is that mixing of radio frequency voltage and DC bias at the terminal 152 causes easy leakage of the radio frequency voltage to the DC bias terminal 148, which affects a bias circuit (not shown in the diagram) for providing the DC terminal 148 with bias. In order to solve the problem, the DC terminal 148 needs to be connected to a ground condenser. In such case, the increase in the number of components is a problem.

The problem of the conventional bipolar transistors shown in FIGS. 5A, 5B and 6 is that it is not possible to increase the negative feedback voltage of Vbe since the base-emitter resistance 122 needs to be reduced in order to improve radio frequency characteristic. This attributes to the provision of the signal generated by synthesizing DC and RF.

As has been described above, in the case of preventing thermal runaway in the conventional bipolar transistor, the radio frequency characteristic is degraded, a gain in the radio frequency amplifier circuit decreases, the cost of the radio frequency amplifier circuit increases, or a bias circuit in the radio frequency amplifier circuit is affected. That is to say, the radio frequency amplifier circuit is greatly affected in various ways.

An object of the present invention is therefore to provide a bipolar transistor and a radio frequency amplifier circuit which can prevent thermal runaway without affecting the radio frequency amplifier circuit.

For further information about technical background to this application is the disclosure of Japanese Patent Application No. 2005-108375 filed on Apr. 5, 2005 including specification, drawings and claims is incorporated herein by reference in its entirety.

The bipolar transistor according to the present invention includes: a first terminal; a second terminal; a first base electrode connected to the first terminal; a second base electrode connected to the second terminal; and a base layer connected to the first base electrode and the second base electrode.

The present invention may also be a radio frequency amplifier circuit comprised of a bipolar transistor including: a first terminal; a second terminal; a first base electrode connected to the first terminal; a second base electrode connected to the second terminal; a bipolar transistor including a base layer connected to the first base electrode and the second base electrode Thus, it is possible to provide a radio frequency signal and a direct-current bias respectively to different terminals, and thus to synthesize the signal and the bias in the base layer. As a result, it is not necessary to equip a coupling condenser for DC cut, therefore, it is possible to prevent thermal runaway without increasing the cost of radio frequency amplifier circuit. Also, since there being no need to set a resistance between an input terminal of the radio frequency signal and the base electrode, it is possible to prevent thermal runway without decreasing a gain in the radio frequency amplifier circuit. In addition, a leakage of the radio frequency signal to a direct-current bias circuit can be prevented, therefore, it is possible to prevent thermal runway without affecting the bias circuit in the radio frequency amplifier circuit. Moreover, there being no need to equip a ground condenser for blocking radio frequency components to a direct-current bias circuit in order to prevent thermal runaway, it is possible to prevent thermal runaway without increasing the number of components. Furthermore, it is possible to prevent thermal runaway without affecting the radio frequency amplifier characteristic since the distance between an emitter and an electrode to which a radio frequency signal is inputted as well as the distance between an emitter and an electrode to which a direct-current bias is inputted can be changed. That is to say, it is possible to prevent thermal runaway without affecting a radio frequency amplifier circuit.

A direct-current bias may be supplied to the first terminal, a radio frequency signal may be supplied to the second terminal, and the direct-current bias and the radio frequency signal may be synthesized in the base layer.

During the operation of the bipolar transistor, a direct-current potential of the second base electrode may be lower than a direct-current potential of the first base electrode.

The bipolar transistor may further include an emitter electrode located between the first base electrode and the second base electrode, wherein a distance between the emitter electrode and the second base electrode may be substantially less than a distance between the emitter electrode and the first base electrode.

Thus, it is possible to increase the effect of negative feedback without giving up the radio frequency characteristic. It is therefore possible to surely prevent thermal runaway in bipolar transistor without affecting a radio frequency amplifier circuit.

With the present invention, it is possible to prevent thermal runaway even in the case where a collector current 1.2 times as much as another bipolar transistor flows in an arbitrary bipolar transistor. Also, in the case where the prevention of thermal runaway is attempted, the following effects can also be achieved: elimination of decrease in radio frequency gain; simplification of circuit layout and prevention of an increase in the cost of radio frequency amplifier circuit due to increase in the chip area; prevention of bad influence on a bias circuit; prevention against increase in the number of components; prevention against the radio frequency characteristic degradation. In other words, it is possible to provide a bipolar transistor and a radio frequency amplifier circuit which are capable of preventing thermal runaway, without affecting the radio frequency amplifier circuit.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 1A is an equivalent circuit schematic of a conventional radio frequency amplifier circuit, whereas FIG. 1B is a diagram showing voltage values and current values in each of the terminals in the radio frequency amplifier circuit;

FIG. 2 is an equivalent circuit schematic showing the conventional radio frequency amplifier circuit;

FIG. 5A is a cross-sectional view showing a structure of the bipolar transistor in the conventional radio frequency amplifier circuit, whereas

FIG. 7A is a cross-sectional view showing a structure of a bipolar transistor in a radio frequency amplifier circuit according to a first embodiment of the present invention, whereas

DESCRIPTION OF THE PREFERRED EMBODIMENT(S)

The following describes a radio frequency amplifier circuit according to the present invention with reference to the diagrams.

First Embodiment

Figure 5A:
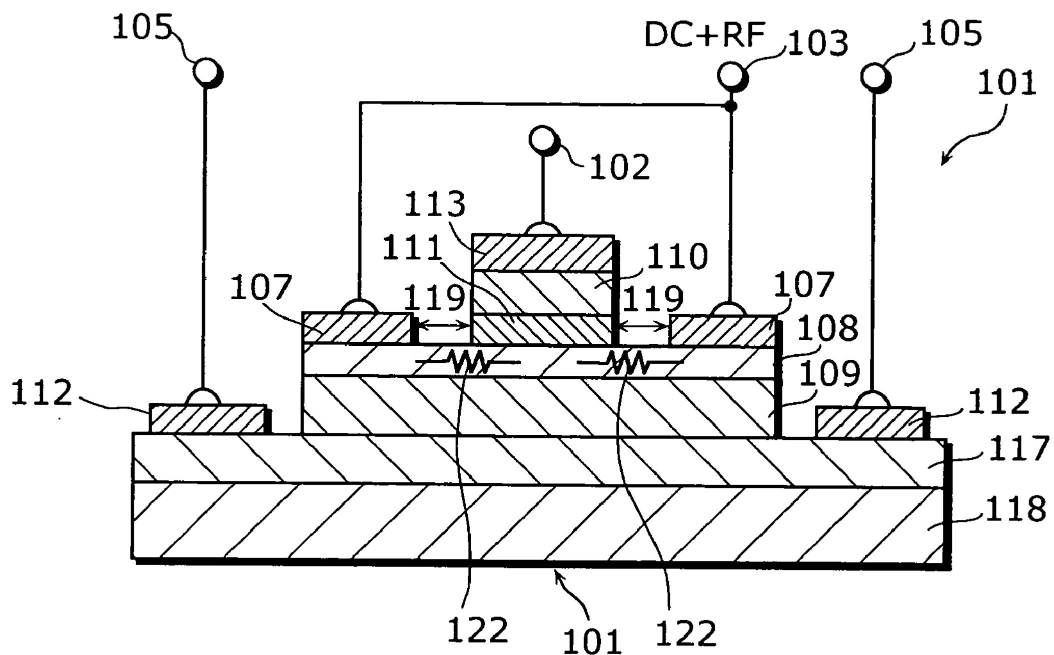
Figure 7A:
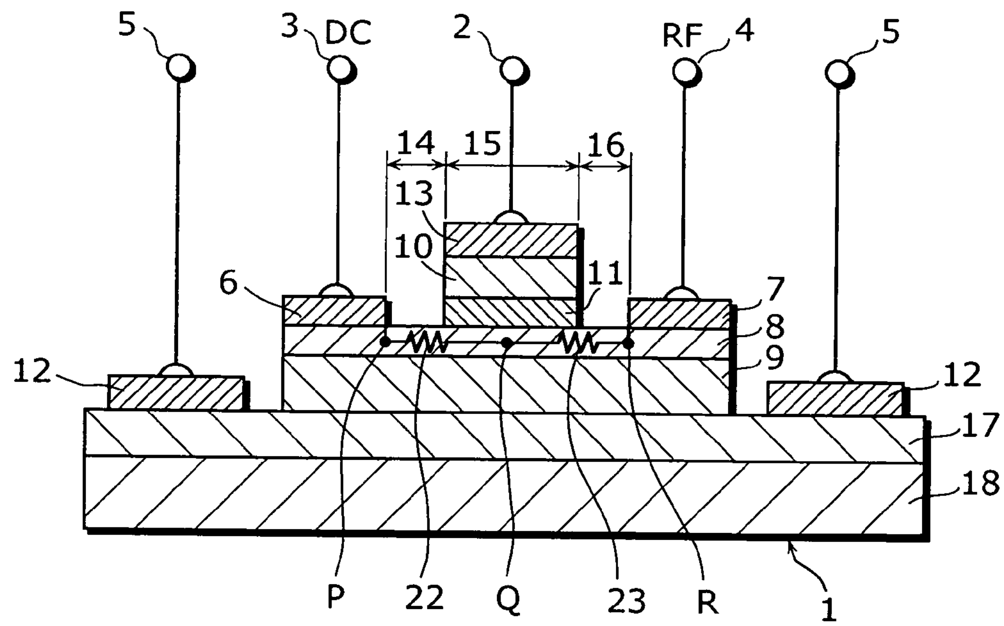
Figure 7B:
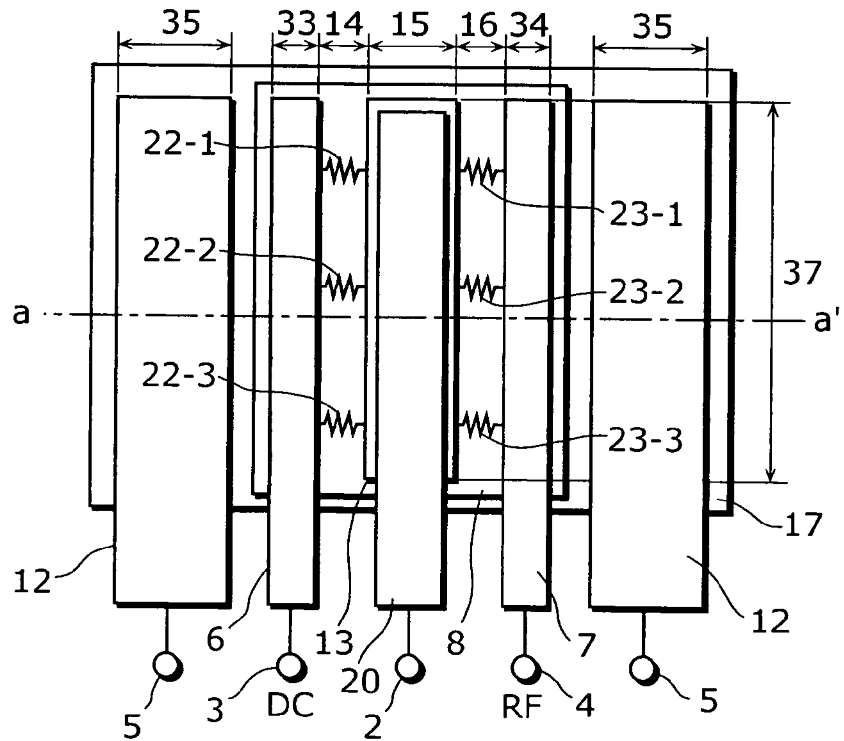
FIG. 7B is a plane view showing the structure of the bipolar transistor in the radio frequency amplifier circuit.

FIG. 7A is a cross-sectional view showing a structure of a transistor 1 in a radio frequency amplifier circuit according to the present embodiment. FIG. 7B is a plane view showing the structure of the transistor 1 whereas FIG. 7A is the cross-sectional view at a dashed line a-a' shown in FIG. 7B. However, an emitter wiring 20 is not shown in FIG. 7A. As shown in FIG. 7A, the difference between the cross-sectional view of the transistor 1 and that of the conventional bipolar transistor 101 shown in FIG. 5A is that a DC terminal 3 to which a direct-current (DC) bias is provided and an RF terminal 4 to which a radio frequency (RF) power is provided are set separately. In other words, the DC bias and the RF power are provided from different electrodes (respectively from a DC base electrode 6 and an RF base electrode 7) to a base layer 8, and another essential difference is that the DC base electrode 6 and the RF base electrode 7 are electrically connected only via the base layer 8. In this case, it is promised that a base current is always provided from the DC base electrode 6 connected to a ballast resistance, by making a potential of the DC base electrode 6 higher than a potential of the RF base electrode 7, which is effective for preventing thermal runaway in the bipolar transistor. Note that the DC terminal 3 and the RF terminal 4 are examples of the respective first and second terminals of the present invention, and the DC base electrode 6 and the RF base electrode 7 are examples of the respective first and second base electrodes of the present invention.

The bipolar transistor 1 shown in FIGS. 7A and 7B is a hetero-junction bipolar transistor (HBT) and is formed by sequentially stacking, on a substrate 18 made of GaAs, a collector contact layer 17 made of $n^+$-type GaAs, a collector layer 9 made of n-type GaAs, a base layer 8 made of p-type GaAs, an emitter layer 11 made of n-type InGaP, and an emitter contact layer 10 made of n-type InGaAs. On the emitter contact layer 10, an emitter electrode 13 is formed, while a collector electrode 12 is formed on the collector contact layer 17, and the DC base electrode 6 and the RF base electrode 7 are formed on the base layer 8. The p-type GaAs which forms the base layer 8 has an impurity concentration of $4\times10^{19}$ $cm^{-3}$, a thickness of 80 nm, and a sheet resistance of 250 ohms/sq. A current amplification factor (hFE) of the bipolar transistor 1 to which such base layer 8 is applied is 50.

In FIGS. 7A and 7B, a DC bias is provided to the DC terminal 3, and then, from the DC terminal 3 to the DC base electrode 6. An RF power is provided to the RF terminal 4, and then is inputted from the RF terminal 4 to the RF base electrode 7. A collector voltage is provided to a collector terminal 5, and then, from the collector terminal 5 to the collector electrode 12. The emitter layer 11 is formed in a position between the DC base electrode 6 and the RF base electrode 7. In the emitter layer 11, a width (a width in an alignment direction in which the DC base electrode 6 and the RF base electrode 7 are aligned) 15 of a finger-shaped portion (hereinafter to be referred to as "finger portion") in a surface pattern is 2 μm, a length (a length of the finger portion is a length in a direction vertical to the alignment direction) 37 of the finger portion in the surface pattern is 20 μm, and the area of the emitter is 40 $\mu m^2$. A width 33 in the alignment direction of the DC base electrode 6, a width 34 in the alignment direction of the RF base electrode 7, a distance 14 between the DC base electrode 6 and the emitter layer 11, and a distance 16 between the RF base electrode 7 and the emitter layer 11 are 1 μm, respectively.

In the base layer 8, assuming that a point P is located directly below the right edge of the DC base electrode 6, a point Q is located directly below the center of the emitter layer 11, and a resistance value of the resistance 22 between the points P and Q is 25 ohms. Similarly, a resistance value of the resistance 23 between the points R and Q is also 25 ohms. As can be seen from FIG. 7B, the resistances 22 and 23 are expressed in terms of fractional constant.

Figure 8:
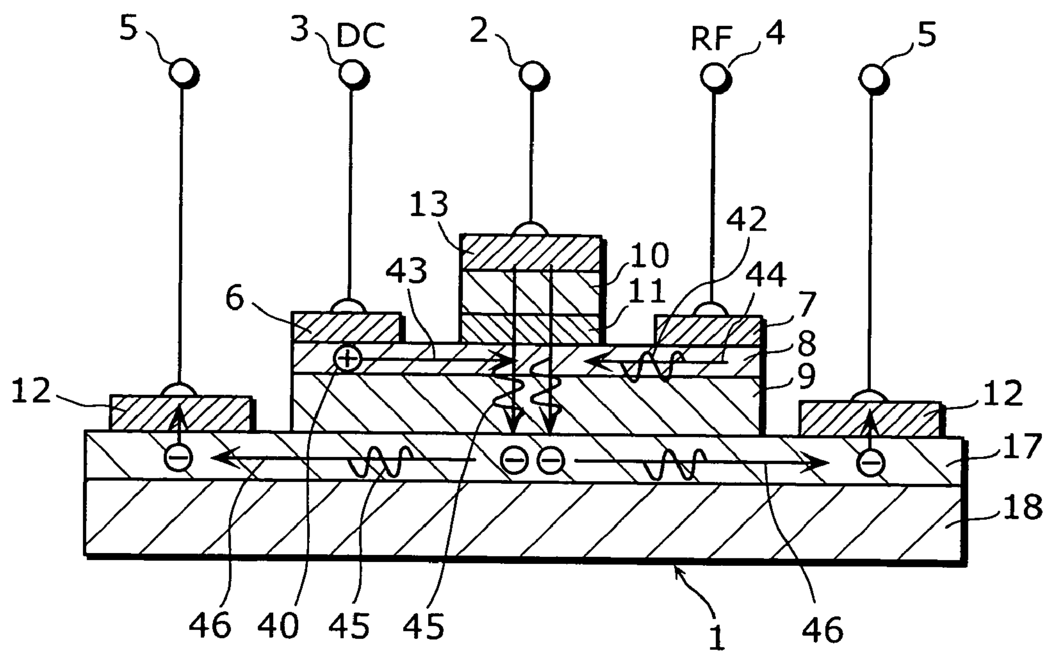
FIG. 8 is a diagram illustrating an operation of the bipolar transistor according to the first embodiment.

FIG. 8 is a diagram illustrating an operation of the bipolar transistor 1 according to the present embodiment. The voltage amount of 1.2 V is applied to the DC base electrode 6 while the voltage amount of 3.5V is applied to the collector electrode 12. The emitter electrode 13 is earthed. A DC current 40 inputted from the DC terminal 3 goes through the base layer 8 in the direction indicated by an arrow 43, and is implanted into a base-emitter junction located immediately below the emitter layer 11, where the DC current 40 is recombined with a part of the electrons provided from the emitter layer 11. An RF 42 inputted from the RF terminal 4 goes through the base layer 8 in the direction indicated by an arrow 44. The DC current 40 and the RF 42 are synthesized in the position immediately below the emitter layer 11 of the base layer 8 and become a DC biased radio frequency power. A radio frequency power 45 amplified by the transistor operation goes through the collector contact layer 17 in the direction indicated by an arrow 46, and then outputted from the collector electrode 12, and then, from the collector terminal 5. In such case, the collector current which flows in the bipolar transistor 1 is 50 mA and the base current is 1 mA.

Figure 9:
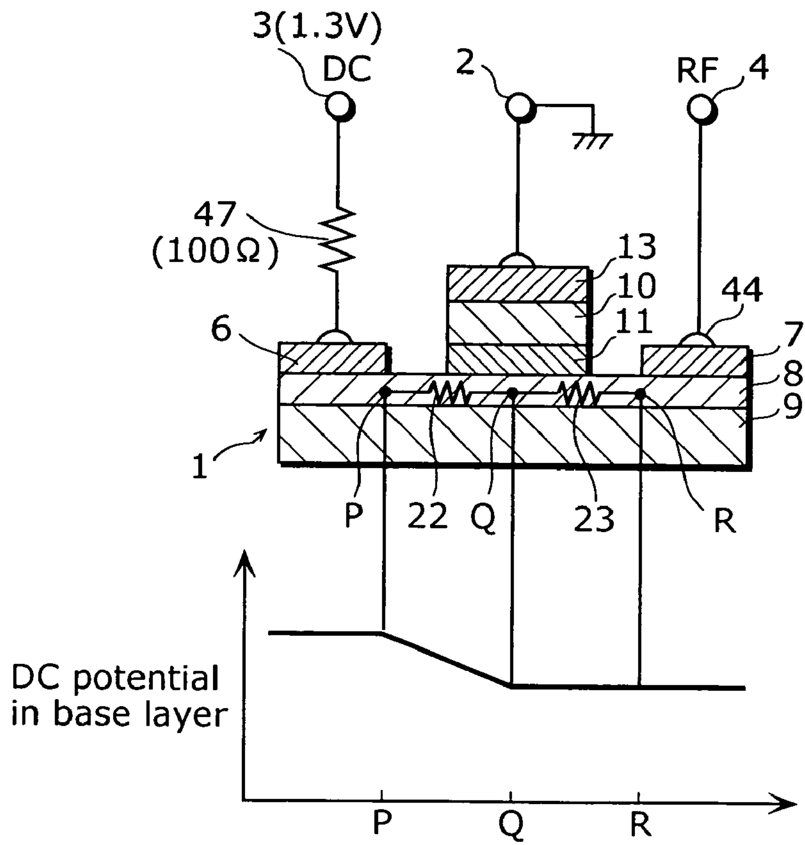
FIG. 9 is a cross-sectional view showing a part of the structure of the bipolar transistor according to the first embodiment, and a distribution of potential in a base layer.

FIG. 9 shows a relationship between a potential distribution in the base layer 8 of the bipolar transistor 1 according to the embodiment and the cross-sectional view shown in FIG. 7A. The cross-sectional view shown in FIG. 9 shows the cross-sectional view in FIG. 7A from which the substrate 18, the collector contact layer 17 and the collector electrode 12 are omitted. A resistance 47 of 100 ohms is placed between the DC terminal 3 and the DC base electrode 6. The voltage of 1.3V is applied to the DC terminal 3 and the emitter terminal 2 is earthed.

Assume here that a base current of 1 mA flows in the base layer 8 in such bipolar transistor 1 as described above. The base current provided from the DC base electrode 6 is implanted into the base-emitter junction located immediately below the emitter layer 11 after passing through the resistance 47, the DC base electrode 6 and the resistance 22. All of the base current provided from the DC terminal 3 is implanted into the base-emitter junction so that the current which flows through the resistance 23 can be ignored. The resistance value of the resistance 22 is 25 ohms. The potential drop at the resistance 22 is 25 mV when the base current of 1 mA passes through the resistance 22. In contrast, no current flows through the resistance 23, therefore, no potential drop occurs. Therefore, the potential of the point P is 1.2V, and the potential of the point Q and the potential of the point R are 1.175V.

Figure 10:
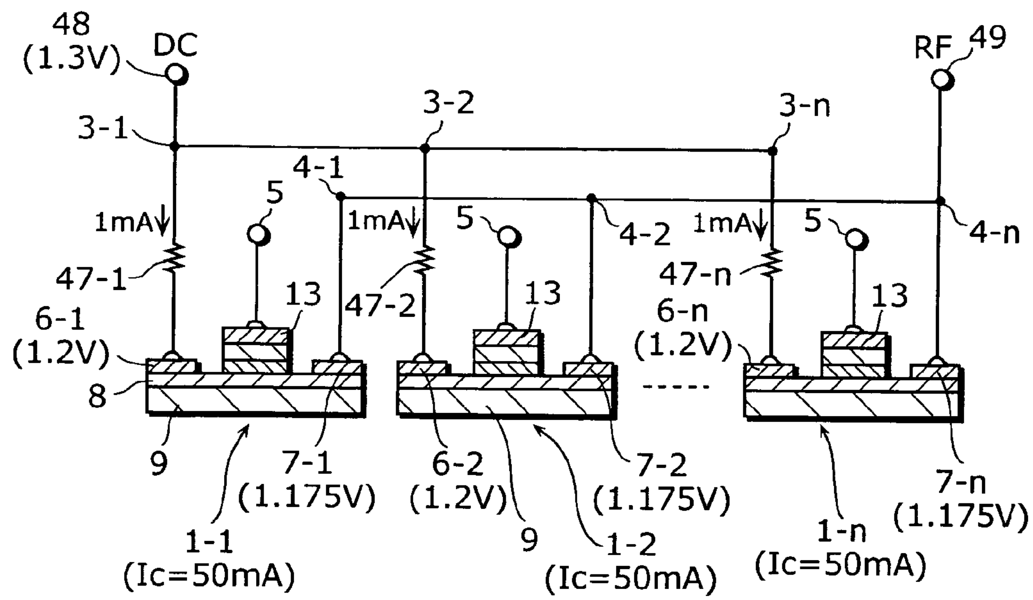
FIG. 10 is a circuit diagram showing a radio frequency amplifier circuit formed by parallely connecting the bipolar transistors as shown in FIG. 9.

FIG. 10 is a circuit diagram sowing a radio frequency amplifier circuit formed by parallely connecting the bipolar transistors 1 as shown in FIG. 9. The n number of bipolar transistors 1-1 to 1-*n* are parallely connected, and each of the DC terminals 3-1 to 3-*n* is connected to a terminal 48 to which a DC bias is provided whereas each of the RF terminals 4-1 to 4-*n* is connected to a terminal 49 to which an RF power is provided. Each of the emitters 5 is earthed. The voltage of 1.3V is applied to the terminal 48, and the potential of the DC base electrodes 6-1 through 6-*n* is 1.2V. Each resistance value of the resistances 47-1 through 47-*n* indicates 100 ohms. In each of the bipolar transistors 1-1 to 1-*n*, a base current is 1 mA and a collector current is 50 mA (indicated as "Ic=50 mA" in the diagram). The DC potential of the RF base electrodes 7-1 through 7-*n* is 1.175V. The base-emitter junction temperature of each of the bipolar transistors 1-1 through 1-*n* is 80 degrees Celsius. In the case where the collector current is the same through each of the bipolar transistors 1-1 through 1-*n*, there should be no difference in temperature.

Figure 11:
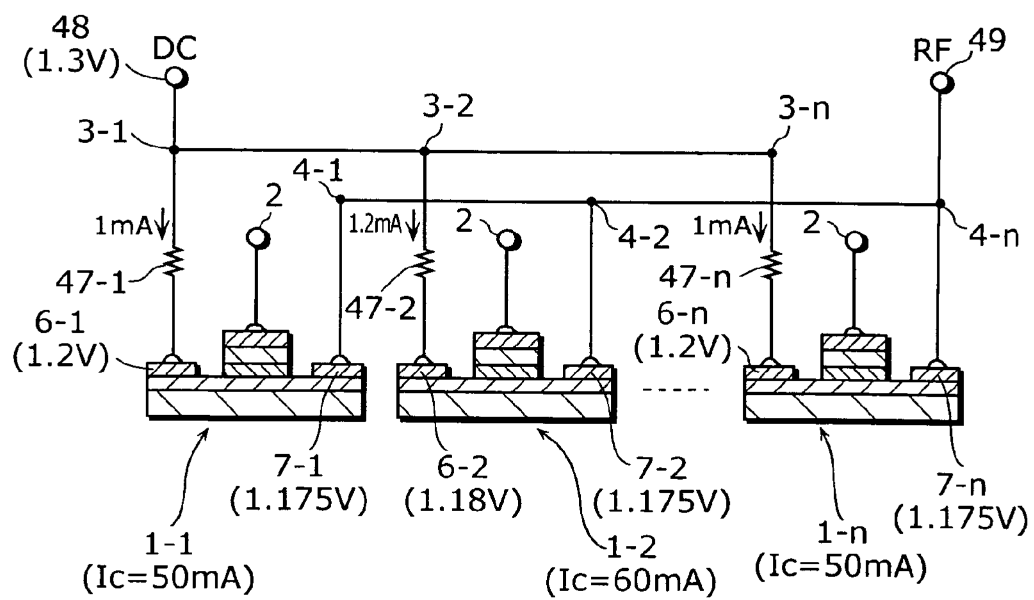
FIG. 11 is a circuit diagram showing a potential when a current, which flows in the radio frequency amplifier circuit formed by parallely connecting the bipolar transistors, increases.

Next, the case where a current concentration occurs in an arbitrary bipolar transistor is considered here. FIG. 11 is a circuit diagram of the radio frequency amplifier circuit showing a potential of each terminal when the collector current that flows in the bipolar transistor 1-2 in the radio frequency amplifier circuit shown in FIG. 10 according to the embodiment increases. It is assumed that a collector current of 60 mA, equivalent of the amount 1.2 times as much as the collector current of another bipolar transistor, flows in the bipolar transistor 1-2. The current amplification factor (hFE) of the bipolar transistors 1-1 through 1-*n* is 50 so that the base current that flows through the resistance 47-2 is 1.2 mA. The voltage drop generated in the resistance 47-2 is 0.12V; therefore, the potential of the DC base electrode 6-2 is 1.18V. The increase in the base current increases the voltage drop in the resistance 47-2 by 0.02V, and the negative feedback of Vbe can be obtained. Even in such case, the RF base electrode 7-2 has the same potential as that of another RF base electrode 7-*n* (n indicates a number other than 2), that is, 1.175V. Owing to the fact that the potential of the DC base electrode 6-2 (1.18V) is higher than the potential of the RF based electrode 7-2 (1.175), the DC current never flows in a direction from the RF base electrode 7-2 to the DC base electrode 6-2.

The increase of the collector current of the bipolar transistor 1-2 from 50 to 60 mA leads to a momentary increase in the junction temperature of the bipolar transistor 1-2 from 80 to 90 degrees Celsius. However, the decrease (17 mV) of Vf in the bipolar transistor 1-2 due to the temperature increase of 10 degrees Celsius is smaller than the negative feedback voltage (20 mV) obtained by the voltage drop in the resistance 47-2, therefore, the collector current in the bipolar transistor 1-2 decreases and thermal runaway can be prevented. In other words, even in the case where a current 1.2 times as much as the current of another bipolar transistor flows in an arbitrary bipolar transistor, it is possible to prevent thermal runaway in the bipolar transistor owing to the effect resulted from the negative feedback of Vbe due to the voltage drop in the resistance 47-2.

Moreover, the distant location of the DC base electrode 6 and the RF base electrode 7 prevents the RF power from passing through the DC base electrode 6 and flowing into a bias circuit (not shown in the diagram) connected to the terminal 48, and the bias circuit is thereby less affected. With such effect, there is no need for a connection between the terminal 48 and a ground condenser, which enables reduction in the number of components.

As has been described above, the bipolar transistor 1 which has separate terminals, a DC base electrode and an RF base electrode to which an RF power and a DC bias are respectively provided, and the emitter layer 11 located between the DC base electrode and the RF base electrode is used in the radio frequency amplifier circuit according to the first embodiment. The potential of the DC base electrode 6 is higher than the potential of the RF base electrode 7, and a base current is always provided from the DC base electrode 6 to which a ballast resistance is connected. Thus, the following advantageous effects can be obtained. That is to say, in comparison with the conventional radio frequency amplifier circuit shown in FIGS. 1A, 1B and 2 it is possible to prevent thermal runaway even in the case where the amount of current 1.2 times as much as the current of another bipolar transistor flows in an arbitrary bipolar transistor. In comparison with the conventional radio frequency amplifier circuit shown in FIG. 3, it is possible to reduce the decrease of radio frequency gain since it is not necessary to place a resistance between a base electrode and an input terminal of the RF power.

In the radio frequency amplifier circuit according to the first embodiment, the potential of the DC base electrode 6 is higher than the potential of the RF base electrode 7 so that the DC current does not flow in a direction from the RF base electrode 7 to the DC base electrode 6. Therefore, compared with the conventional radio frequency amplifier circuit shown in FIG. 4, there is no need to equip each of the bipolar transistors with a DC cut condenser 151, and it is possible to simplify a circuit layout and prevent the increase in the cost of radio frequency amplifier circuit due to the increase in the chip area. Also, the flow of RF components into a DC bias circuit can be prevented; therefore, it is possible to prevent the DC bias circuit from being affected. In addition, a ground condenser needs not to be connected to the terminal 48, therefore, it is possible to reduce the number of components.

Figure 5B:
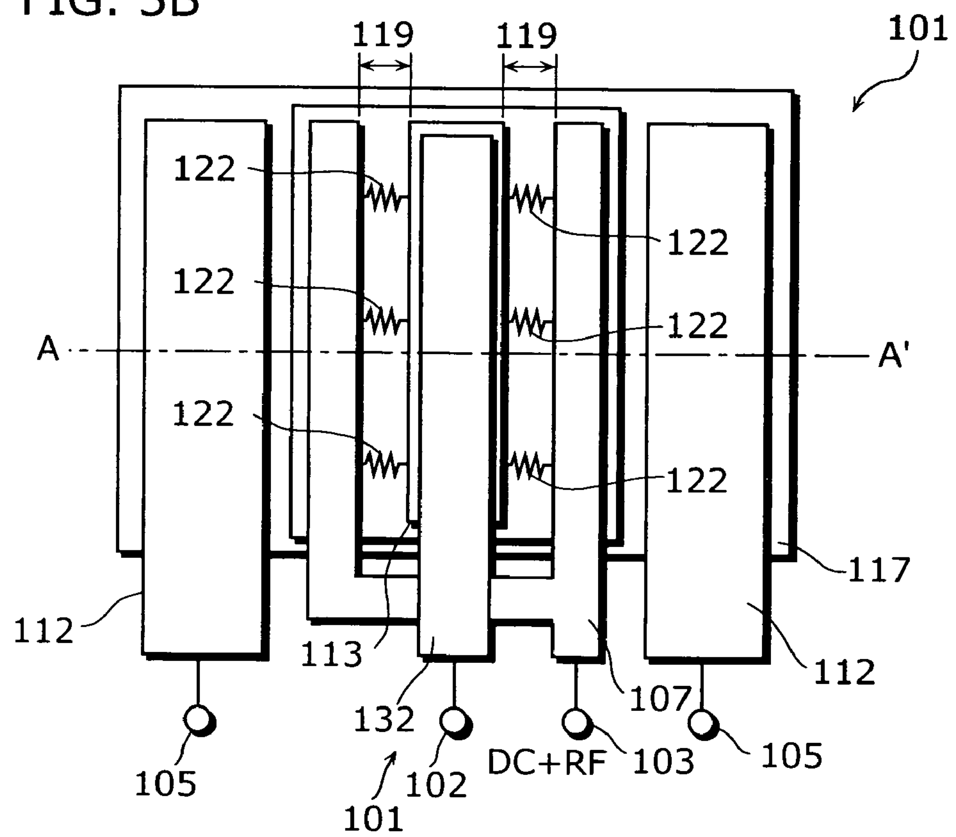
FIG. 5B is a plane view showing the structure of the bipolar transistor in the conventional radio frequency amplifier circuit.
Figure 6:
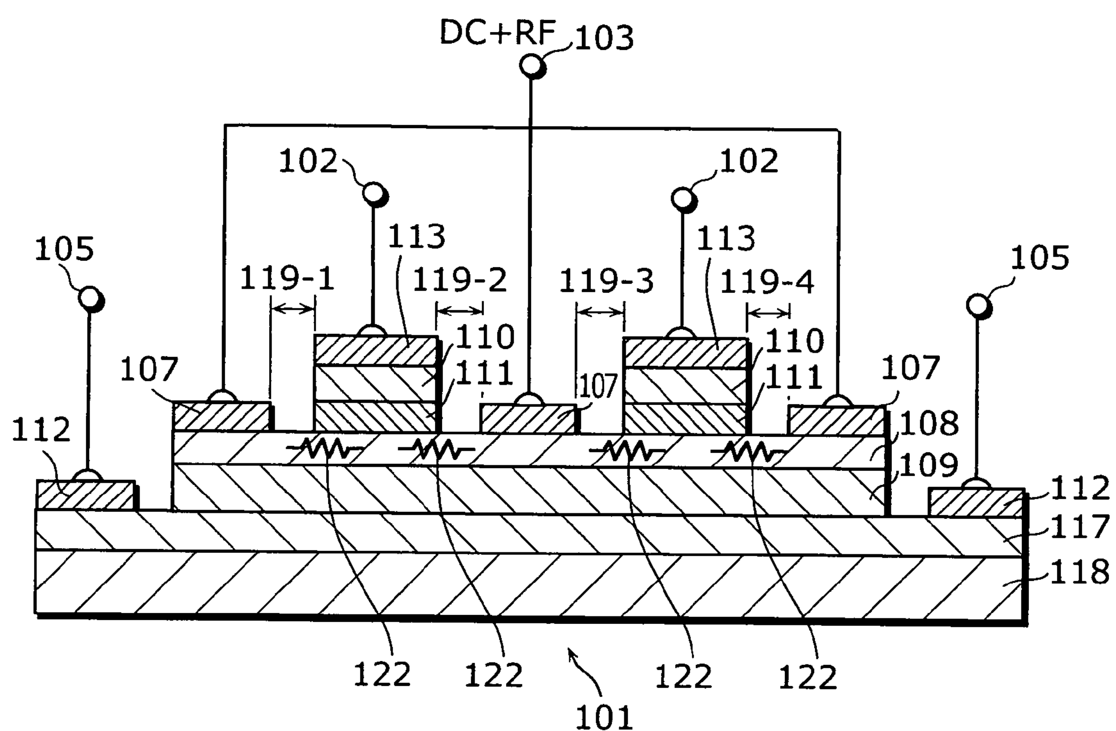
FIG. 6 is a cross-sectional view showing another bipolar transistor in the conventional radio frequency amplifier circuit.

With the present bipolar transistor, it is possible to freely change the distance between the RF base electrode 7 and the emitter electrode 13 as well as the distance between the DC base electrode 6 and the emitter electrode 13. Therefore, compared with the bipolar transistors shown in FIGS. 5A, 5B and 6, by making the distance between the RF base electrode 7 and the emitter electrode 13 shorter than the distance between the DC base electrode 6 and the emitter electrode 13, it is possible to improve the radio frequency characteristic and to prevent thermal runaway to the greater extent.

As a result, it is possible to prevent thermal runaway without affecting the radio frequency amplifier circuit, compared with the conventional radio frequency amplifier circuit.

Note that, the present embodiment describes that the emitter layer 11 is located between the DC base electrode 6 and the RF base electrode 7 in the radio frequency amplifier circuit, however, the position relation is not restricted to this case.

Second Embodiment

Next, the case where the collector current of 70 mA 1.4 times as much as that of another bipolar transistor flows in the bipolar transistor 1-2, in the radio frequency amplifier circuit shown in FIG. 10 according to the first embodiment, is considered. As shown in FIG. 11, hFE of the bipolar transistors 1-1 through 1-*n* is 50 so that a base current which flows through the resistance 47-2 is 1.4 mA, a voltage drop generated in the resistance 47-2 is 0.14V, and a potential of the electrode 6-2 is 1.16V whereas a potential of the electrode 7-2 is 1.175. In such case, the potential (1.175V) of the electrode 7-2 becomes higher than the potential (1.16V) of the electrode 6-2, therefore, the base current of the bipolar transistor 1-2 is provided from the electrode 7-2. Namely, the negative feedback voltage of Vbe is obtained as 0.025V as a result of subtracting 1.175V from 1.2V. With the increase in the collector current of the bipolar transistor 1-2 from 50 to 70 mA, a junction temperature of the bipolar transistor 1-2 momentarily rises by 20 degrees Celsius from 80 to 100 degrees Celsius while Vf decreases by 0.034V. Therefore, in such case, the decrease of Vf (0.034V) being greater than the negative feedback voltage (0.025V), the collector current of the bipolar transistor 1-2 continues to increase, which eventually results in thermal runaway. In other words, in the case where the amount of current 1.4 times as much as the current of another bipolar transistor flows in an arbitrary transistor, thermal runaway cannot be avoided. The following describes the radio frequency amplifier circuit according to the second embodiment for overcoming such problem.

Figure 12:
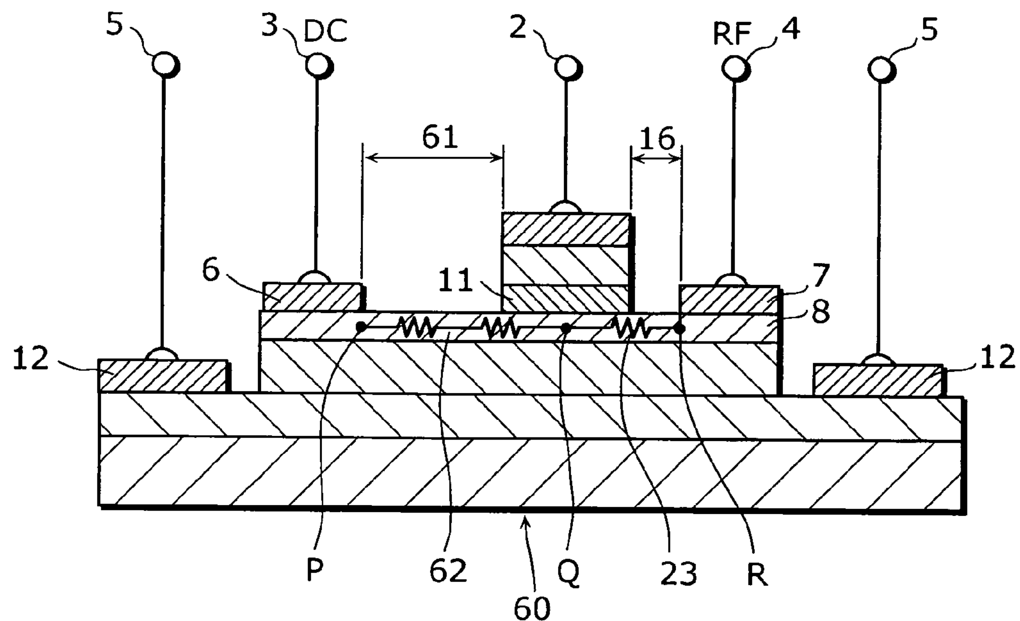
FIG. 12 is a cross-sectional view showing the structure of the bipolar transistor in a radio frequency amplifier circuit, according to a second embodiment of the present invention.

FIG. 12 is a cross-sectional view showing a structure of a bipolar transistor 60 in the radio frequency amplifier circuit according to the present embodiment. The difference between the structure of the present bipolar transistor 60 and that of the bipolar transistor 1 according to the first embodiment shown in FIG. 7A is that the distance 16 between the emitter layer 11 and the RF base electrode 7 is shorter than the distance 61 between the emitter layer 11 and the DC base electrode 6. Namely, the distance 61 between the DC base electrode 6 and the emitter layer 11 increases from 1 to 3 μm. Thus, a resistance 62 at P-Q in the base layer 8 increases from 25 to 50 ohms. Therefore, the voltage drop, which is generated in the resistance 62 when the base current of 1 mA flows, increases from 0.025 to 0.05V. Considering the radio frequency characteristic of the bipolar transistor 60, the distance 16 between the RF base electrode 7 through which a radio frequency power passes, and the emitter layer 11 is the same as the distance 16 of the bipolar transistor 1 shown in FIGS. 7A and 7B, therefore, the bipolar transistor 60 has the same radio frequency characteristic as that of the bipolar transistor 1.

Figure 13:
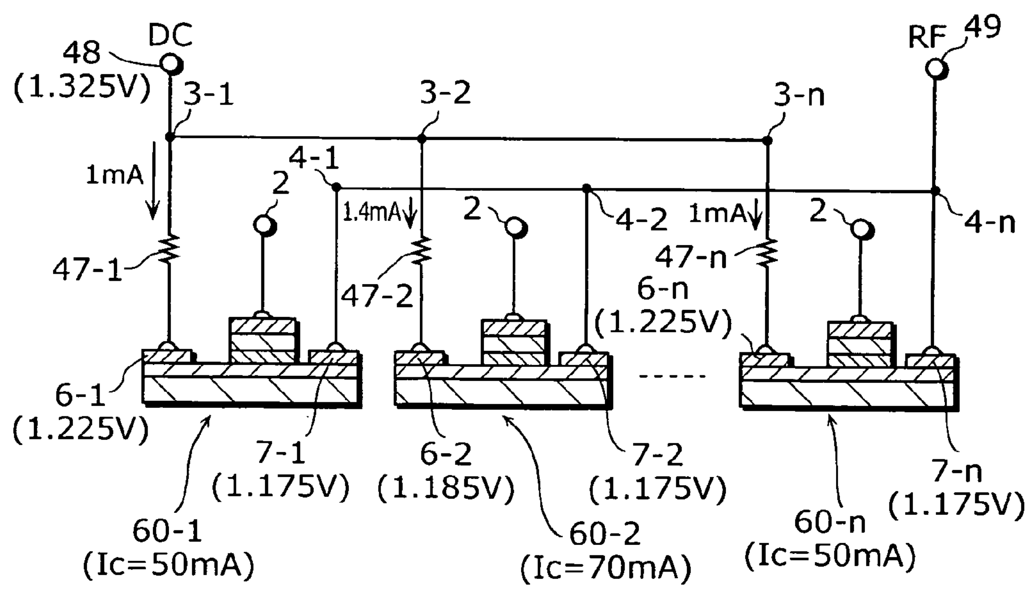
FIG. 13 is a circuit diagram showing a radio frequency amplifier circuit formed by parallely connecting the bipolar transistors as shown in FIG. 12.

FIG. 13 is a circuit diagram showing a radio frequency amplifier circuit formed by parallely connecting the bipolar transistors as shown in FIG. 12. The case assumes that a collector current of 70 mA, equivalent of the amount of current 1.4 times as much as the current of another bipolar transistor, flows in the bipolar transistor 60-2. The voltage applied to the terminal 48 is 1.325V. The hFE of the bipolar transistors 60-1 to 60-*n* being 50, the base current which flows through the resistances 47-1 to 47-*n* (n indicates a number other than 2) is 1 mA, the voltage drop generated in the resistances 47-1 to 47-*n* (n indicates a number other than 2) is 0.1V, the potential of the electrodes 6-1 through 6-*n* (n indicates a number other than 2) is 1.225V. The amount of the base current in the resistance 47-2 is 1.4 mA, the voltage drop generated in the resistance 47-2 is 0.14V, and the potential of the DC base electrode 6-2 is 1.185V. Even in such case, the RF base electrode 7-2 has the same potential as that of another one of the RF base electrode 7-1 through 7-*n* (n indicates a number other than 2), that is, 1.175V. Consequently, the potential (1.185V) of the DC base electrode 6-2 is higher than the potential (1.175V) of the RF base electrode 7-2, therefore, the base current of the bipolar transistor 60-2 shall never provided from the RF base electrode 7-2.

The reason for increasing the resistance 62 between the points P and Q, not the resistance 47, will be described. In the case where the resistance 47 and the resistance 62 are designed to have 125 ohms and 25 ohms respectively, when a current of 1.4 mA flows through the resistance 47-2, a voltage drop at the resistance 47-2 is 0.175V and the potential of the DC base electrode 6-2 is 1.15V. In this case, the potential (1.15V) of the DC base electrode 6-2 being lower than the potential (1.175V) of the RF base electrode 7-2, the base current of the bipolar transistor 60-2 is provided from the RF base electrode 7-2. This causes an inconvenience.

The increase in the amount of collector current of the bipolar transistor 60-2 from 50 to 70 mA momentarily increases a junction temperature of the bipolar transistor 60-2 by 20 degrees Celsius from 80 to 100 degrees Celsius, and Vf decreases by 0.034V. Even in such case, the decrease (0.034V) in Vf of the bipolar transistor 60-2 is smaller than the negative feedback voltage (0.04V) obtained due to the voltage drop in the resistance 47-2, so that the amount of the collector current in the bipolar transistor 60-2 decreases and no thermal runaway occurs. In other words, even in the case where the amount of current 1.4 times as much as the current of another bipolar transistor flows in an arbitrary transistor, it is possible to prevent thermal runaway in the bipolar transistor owing to the effects achieved by the negative feedback of Vbe due to the voltage drop in the resistance 47-2.

As has been described above, the bipolar transistor 60, in which the distance 61 between the DC base electrode 6 and the emitter 11 is made longer than the distance 16 between the RF base electrode 7 and the emitter layer 11, is used in the radio frequency amplifier circuit of the second embodiment. Therefore, compared with the radio frequency amplifier circuit according to the first embodiment, the potential of the DC base electrode 6 is higher than the potential of the RF base electrode 7 so that the base current is always provided from the DC base electrode 6 connected to a ballast resistance, even in the case where the collector current 1.4 times as much as the current of another bipolar transistor flows in an arbitrary bipolar transistor. As a result, it is possible to prevent thermal runaway in the bipolar transistor owing to the effect achieved by the negative feedback of Vbe due to the voltage drop in the resistance 47.

According to the bipolar transistor of the second embodiment, in the radio frequency amplifier circuit, the distance between the DC base electrode 6 and the emitter electrode 13 is longer than the distance between the RF base electrode 7 and the emitter electrode 13, compared with the radio frequency amplifier circuit according to the first embodiment. Therefore, it is possible to surely prevent thermal runaway without giving up the radio frequency characteristic.

Third Embodiment

Figure 14:
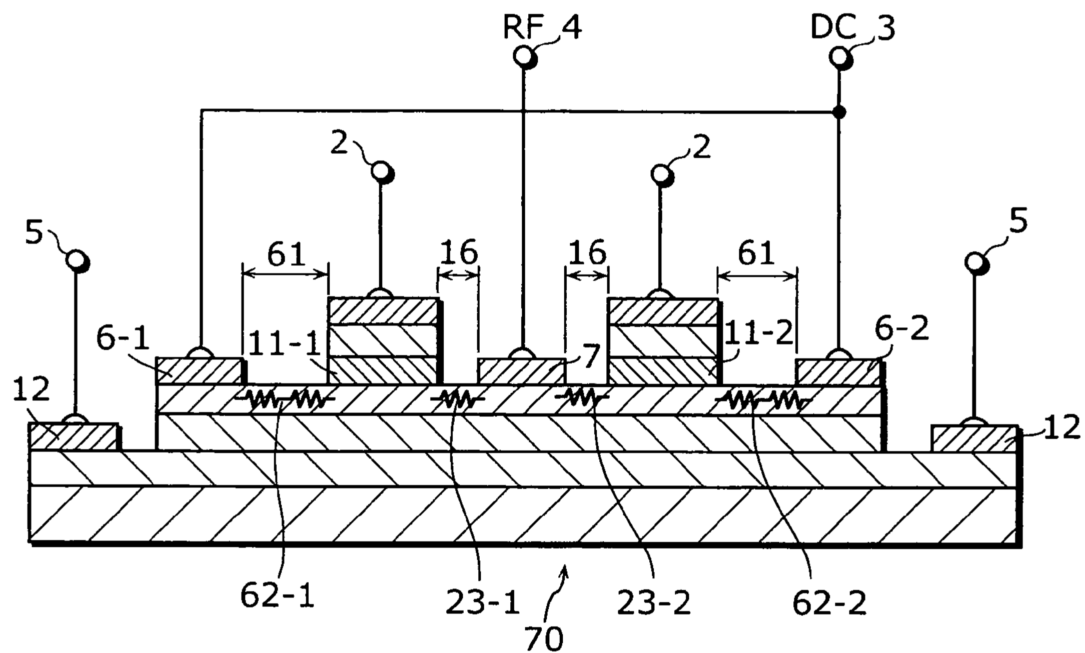
FIG. 14 is a cross-sectional view showing a structure of a bipolar transistor in a radio frequency amplifier circuit, according to a third embodiment of the present invention.

FIG. 14 is a cross-sectional diagram showing a structure of a bipolar transistor 70 in the radio frequency amplifier circuit according to the third embodiment. The difference between the present bipolar transistor 70 and the bipolar transistor 60, shown in FIG. 12, according to the second embodiment is that the former includes plural DC base electrodes 6-1 and 6-2 and further has plural emitter layers 11-1 and 11-2. The bipolar transistor 70 has an emitter area two times as much as that of the bipolar transistor 60 and can obtain, on a cell basis, a current capacitor twice as much as that of the bipolar transistor 60. As is the case of the bipolar transistor 60, it is possible to prevent deconstruction due to the thermal runaway in the bipolar transistor when a current concentration occurs in an arbitrary bipolar transistor. This can be realized by setting the respective distances 61 between the DC base electrode 6-1 and the emitter layer 11-1 as well as between the DC base electrode 6-2 and the emitter electrode 11-2 to be 3 μm, and the respective distances 16 between the RF base electrode 7 and the emitter layer 11-1, as well as between the RF base electrode 7 and the emitter layer 11-2 to be 0.5 μm. It is also possible to surely prevent such thermal runway without giving up the radio frequency characteristic.

Fourth Embodiment

Figure 15:
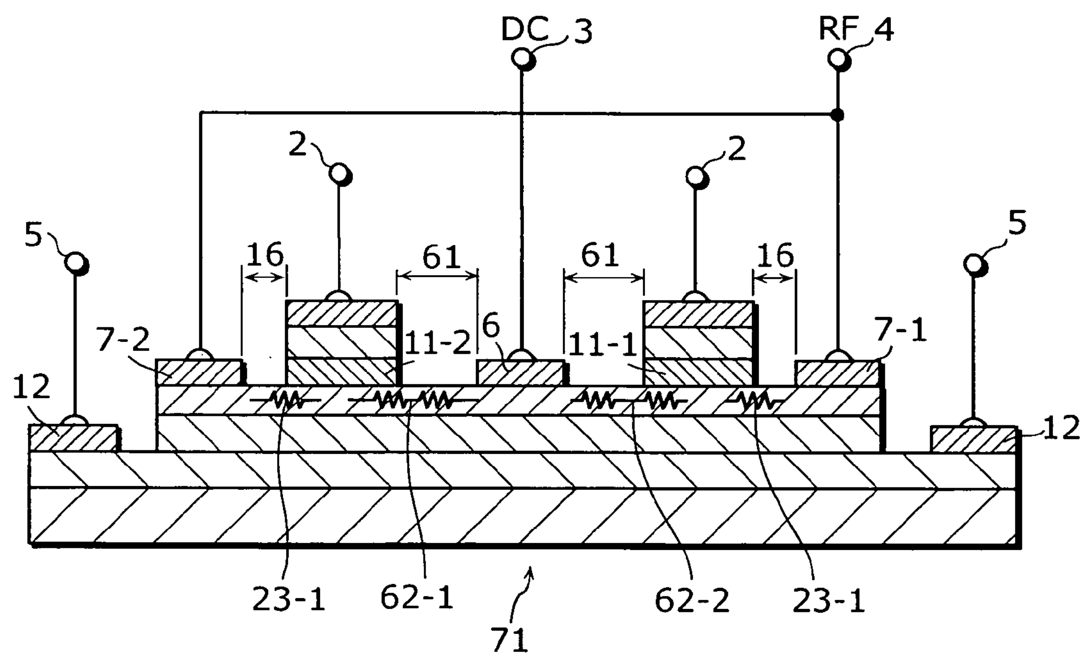
FIG. 15 is a cross-sectional view showing a structure of a bipolar transistor in a radio frequency amplifier circuit, according to a fourth embodiment of the present invention.

FIG. 15 is a cross-sectional view showing a structure of a bipolar transistor 71 in the radio frequency amplifier circuit according to the fourth embodiment. The difference between the bipolar transistor 71 and the bipolar transistor 60, shown in FIG. 12, according to the second embodiment is that the former has plural RF base electrodes 7-1 and 7-2 and further includes plural emitter layers 11-1 and 11-2. The bipolar transistor 71 has an emitter area two times as much as that of the bipolar transistor 60, and can obtain, on a cell basis, a current capacitor two times as much as that of the bipolar transistor 60. As is the case of the bipolar transistor 60 shown in FIG. 12, by setting the respective distances 61 between the DC base electrode 6 and the emitter layers 11-1 as well as between the DC base electrode 6 and the emitter 11-2 to be 3 μm, and the respective distances between the RF base electrode 7-1 and the emitter layer 11-1 as well as between the RF base electrode 7-2 and the emitter layer 11-2 to be 0.5 μm, it is possible to prevent deconstruction due to the thermal runaway in the bipolar transistor when a current concentration occurs in an arbitrary bipolar transistor. It is also possible to surely prevent such thermal runway without giving up the radio frequency characteristic.

Fifth Embodiment

Figure 3:
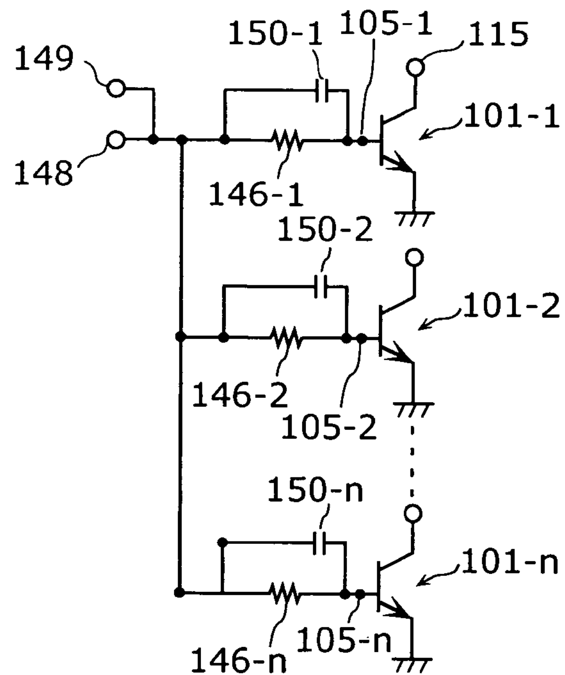
FIG. 3 is an equivalent circuit schematic showing the conventional radio frequency amplifier circuit.
Figure 4:
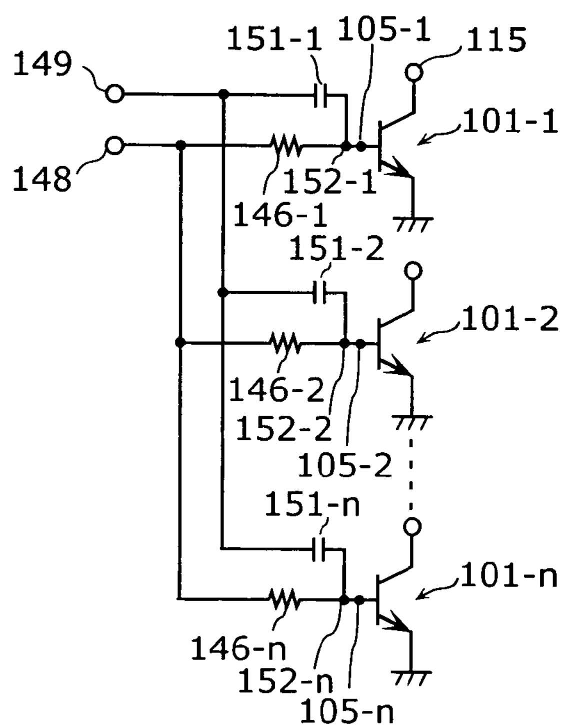
FIG. 4 is an equivalent circuit schematic showing the conventional radio frequency amplifier circuit.
Figure 16:
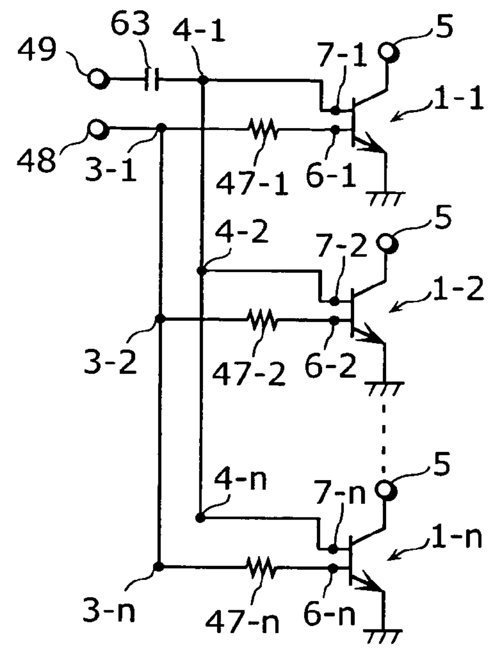
FIG. 16 is a circuit diagram showing a radio frequency amplifier circuit using the bipolar transistor shown in FIGS. 7A and 7B, according to a fifth embodiment of the present invention.

FIG. 16 is a circuit diagram showing a radio frequency amplifier circuit using the bipolar transistor 1 according to the first embodiment. This corresponds to another version obtained by representing, as an equivalent circuit, the circuit diagram of the radio frequency amplifier circuit shown in FIG. 10 formed by parallely connecting the bipolar transistors 1. The difference between the present circuit shown in FIG. 16 and the conventional circuit shown in FIGS. 2, 3 and 4 is that the DC bias provided from the terminal 48 and the RF power provided from the terminal 49 are separately provided to the bipolar transistors 1-1 through 1-*n*, and are not electrically synthesized outside the bipolar transistors 1-1 through 1-*n*. Thus, as is already explained with reference to FIG. 9, there rises the essential difference that the DC potential of the DC base electrode 6 is different from the DC potential of the RF base electrode 7.

In the radio frequency amplifier circuit shown in FIG. 16, n number of bipolar transistors 1-1 to 1-*n* are parallely connected. In such case, ones of the bipolar transistors 60, 70 or 71 according to the second through fourth embodiments may be used as the bipolar transistors 1-1 through 1-*n*. The terminal 48 for DC bias is connected to the DC terminals 3-1 through 3-*n*, the resistances 47-1 through 47-*n*, and then to the DC base electrodes 6-1 through 6-*n* in such order. The RF terminal 49 is connected to the condenser 63, the RF terminals 4-1 through 4-*n*, and then to the RF base electrodes 7-1 through 7-*n* in such order.

Figure 17:
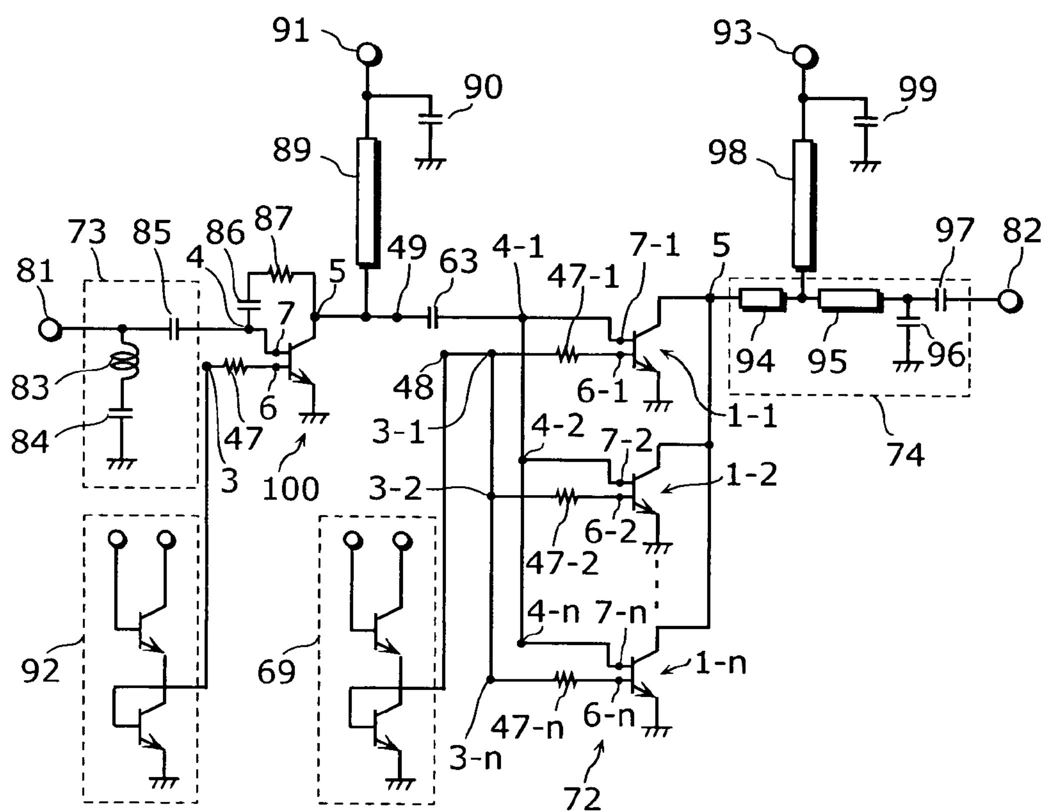
FIG. 17 is a circuit diagram showing a two-staged power amplifier circuit using the radio frequency amplifier circuit according to the fifth embodiment.

FIG. 17 is a circuit diagram showing a two-staged power amplifier circuit using the radio frequency amplifier circuit shown in FIG. 16. In the two-staged power amplifier circuit, the radio frequency amplifier circuit described above is used for a front-stage transistor 100 and a rear-stage transistor 72. That is to say, in the front-stage transistor 100, the bipolar transistors 1-1 through 1-*n* with an emitter area of 120 $\mu m^2$ are parallely connected as four cells. In the rear-stage transistor 72, the bipolar transistors 1-1 through 1-*n* are parallely connected as twenty cells. The voltage of 3.5V is applied to a front-stage transistor collector voltage terminal 91 and a rear-stage transistor collector voltage terminal 93. Such two-staged power amplifier circuit has a radio frequency gain of 28 dB, and a maximum output of 2.3 W in a frequency of 800 $MH_z$ band. A current consumption of the front-stage transistor 100 is 200 mA while a current consumption of the rear-stage transistor 72 is 1000 mA, and a power conversion ratio in this case is 55%.

A front-stage transistor bias circuit 92 supplies, via the resistance 47, the DC base electrode 6 of the front-stage transistor 100 with a DC bias. A rear-stage transistor bias circuit 69 supplies, with a DC bias, the DC base electrodes 6-1 through 6-*n*, via the resistances 47-1 through 47-*n*. An input matching circuit 73 is made up of an inductor 83 and condensers 84 and 85. A stage matching between the front-stage transistor 100 and the rear-stage transistor 72 is formed by a condenser 63, a bias supply line 89 intended for the front-stage transistor 100. A load matching circuit 74 is structured by lines 94 and 95 as well as condensers 96 and 97. The load matching circuit 74 is connected to a bias supply line 98 intended for the rear-stage transistor 72.

The radio frequency power inputted from the terminal 81 passes through the input matching circuit 73 and the RF base electrode 7 of the front-stage transistor 100, and then inputted into the front-stage transistor 100. The radio frequency power amplified by the front-stage transistor 100 passes through the inter-stage matching condenser 63, the RF base electrodes 7-1 through 7-*n* of the rear-stage transistor 72, and then inputted into the rear-stage transistor 72. The radio frequency power amplified by the rear-stage transistor 72 passes through the load matching circuit 74 and outputted from the terminal 82. In the front-stage transistor 100, a series circuit made up of the resistance 87 and the condenser 86 is connected between the collector terminal 5 and the RF base electrode 7 of the front-stage transistor 100, and the circuit is used as a feedback circuit for stabilizing the operation of the amplifier circuit.

Sixth Embodiment

Figure 18:
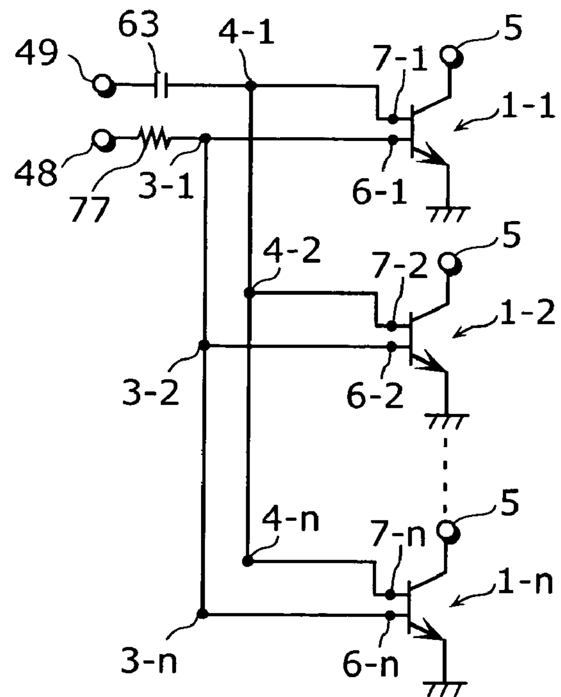
FIG. 18 is a circuit diagram showing a radio frequency amplifier circuit using the bipolar transistor shown in FIGS. 7A and 7B, according to a sixth embodiment of the present invention.

FIG. 18 is a circuit diagram showing another radio frequency amplifier circuit using the bipolar transistor 1 according to the first embodiment. The difference between the circuit shown in FIG. 18 and the circuit shown in FIG. 16 according to the fifth embodiment, is that the resistances 47-1 through 47-*n* are not set in each of the bipolar transistors 1-1 through 1-*n*, but one resistance 77 is connected to the DC base electrodes 6-1 through 6-*n* of the bipolar transistors 1-1 through 1-*n*. In such case, the resistance value of the resistance 77 needs to be 5 ohms. The excellent point of such circuit structure is that it requires only one resistance so that it is possible to simplify a circuit layout and to lower the cost of radio frequency amplifier circuit owing to reduction in the chip area. In the case of using the conventional bipolar transistor 101, however, the resistance 77 (the resistance 147 in FIGS. 1A and 1B) itself cannot give enough negative feedback to Vbe of the bipolar transistors 1-1 through 1-*n* (bipolar transistors 101-1 through 101-*n* in FIGS. 1A and 1B), as is already mentioned in FIGS. 1A and 1B. The bipolar transistor 1 according to the present embodiment internally has a resistance whose resistance value can be freely set owing to its original structure, and thereby produces by itself the effect of suppressing thermal runaway due to the negative feedback of Vbe. As a result, even with the structure as shown in FIG. 18, it is possible to suppress thermal runaway by optimizing the design of the bipolar transistors 1-1 through 1-*n*.

As has been described above, with the use of the bipolar transistor 1 according to the first embodiment for the present radio frequency amplifier circuit, it is possible to suppress thermal runaway as well as to realize the simplification of circuit layout and a low cost of radio frequency amplifier circuit due to the reduction in the chip area, compared to the radio frequency amplifier circuit according to the fifth embodiment.

Seventh Embodiment

Figure 19:
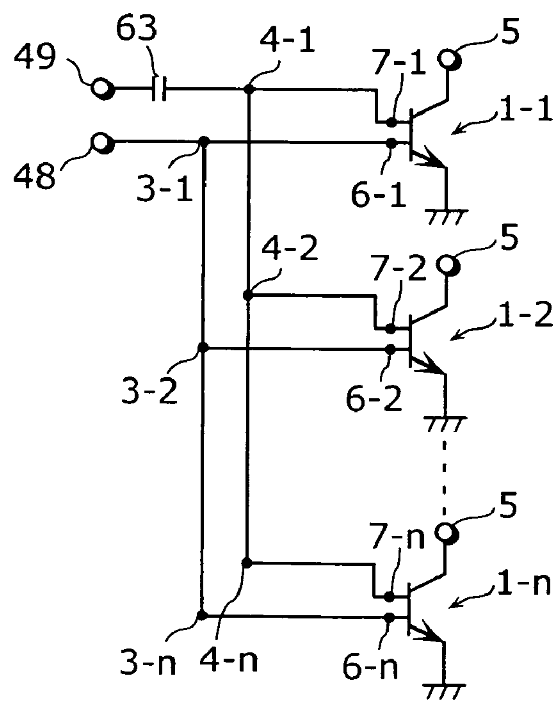
FIG. 19 is a circuit diagram showing a radio frequency amplifier circuit using the bipolar transistor shown in FIGS. 7A and 7B, according to a seventh embodiment of the present invention.

FIG. 19 is a circuit diagram showing another radio frequency amplifier circuit using the bipolar transistor 1 according to the first embodiment. The difference between the present radio frequency amplifier circuit shown in FIG. 19 and the radio frequency amplifier circuit shown in FIG. 18 according to the sixth embodiment is that the resistance 77 is omitted. The respective bipolar transistors 1-1 through 1-*n* internally has a resistance whose value can be freely set owing to its original structure, and produces by itself the effect of suppressing thermal runaway due to the negative feedback of Vbe. As a result, even with the structure shown in FIG. 19, it is possible to reduce thermal runaway as in the case of the radio frequency amplifier circuit shown in FIG. 18.

As has been described above, with the use of the bipolar transistor 1 according to the first embodiment for the present radio frequency amplifier circuit, it is possible to suppress thermal runaway as well as to realize simplification of the circuit layout and a low cost of radio frequency amplifier circuit due to the reduction in the chip area, compared with the radio frequency amplifier circuit according to the sixth embodiment.

Eighth Embodiment

Figure 20:
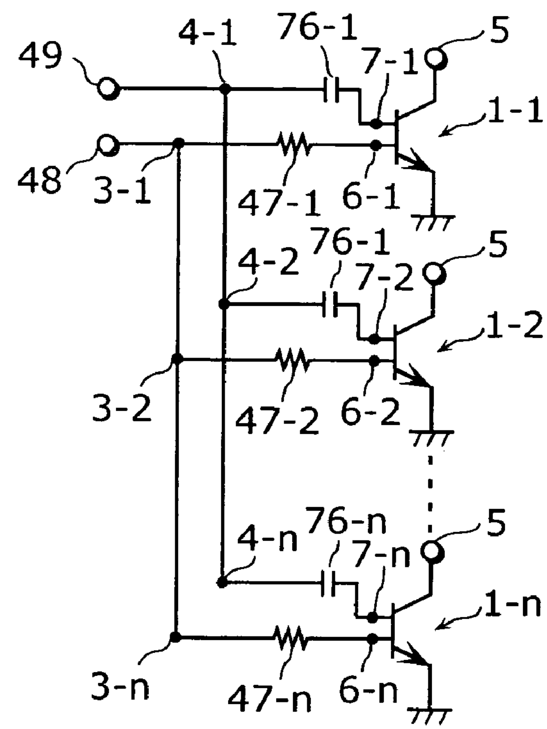
FIG. 20 is a circuit diagram showing a radio frequency amplifier circuit using the bipolar transistor shown in FIGS. 7A and 7B, according to an eighth embodiment of the present invention.

FIG. 20 is a circuit diagram showing a radio frequency amplifier circuit using the bipolar transistor 1 according to the first embodiment. The difference between the present circuit shown in FIG. 20 and the radio frequency amplifier circuit shown in FIG. 16 according to the fifth embodiment is that one condenser 63 is not placed between the terminal 49 and RF terminals 4-1 through 4-*n*, but plural condensers 76-1 through 76-*n* are each connected between the RF terminals 4-1 through 4-*n* and the RF base electrodes 7-1 through 7-*n*. As already described in FIG. 16, the condenser 63 is used for impedance matching. In order to satisfy such matching condition in FIG. 20, the radio frequency amplifier circuit needs to be designed so that a sum of the capacitance values of the condensers 76-1 through 76-*n* equals to a capacitance value of the condenser 63. Thus, it is possible to surely cut DC in a path through which the RF power is provided.

Ninth Embodiment

Figure 21:
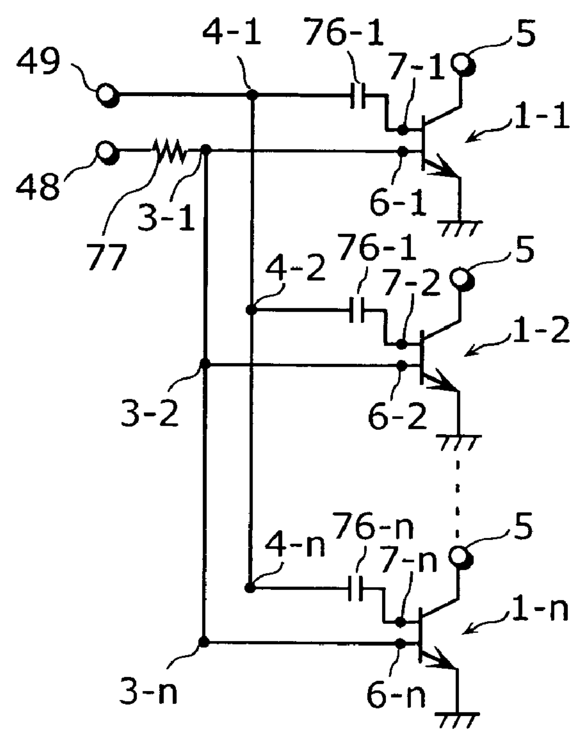
FIG. 21 is a circuit diagram showing a radio frequency amplifier circuit using the bipolar transistor shown in FIGS. 7A and 7B, according to a ninth embodiment of the present invention.

FIG. 21 is a circuit diagram showing a radio frequency amplifier circuit using the bipolar transistor 1 according to the first embodiment. The difference between the present circuit shown in FIG. 21 and the radio frequency amplifier circuit shown in FIG. 20 according to the eighth embodiment is that resistances 47 through 47-*n* are not placed in each of the bipolar transistors 1-1 through 1-*n*, but one resistance 77 is connected to the DC base electrodes 6-1 through 6-*n* of the bipolar transistors 1-1 through 1-*n*. In this case, a resistance value of the resistance 77 is required to indicate 5 ohms. The respective bipolar transistors 1-1 through 1-*n* internally has a resistance whose resistance value can be freely set owing to its original structure, and produces by itself the effect of preventing thermal runaway due to the negative feedback of Vbe. As a result, even with the structure as shown in FIG. 21, it is possible to prevent thermal runaway by optimizing the design of the bipolar transistors 1-1 through 1-*n*. With the radio frequency amplifier circuit of the present embodiment, it is possible to suppress thermal runaway as well as to realize simplification of the circuit layout and a low cost of radio frequency amplifier circuit due to the reduction in the chip area, compared to the radio frequency amplifier circuit according to the eighth embodiment.

Tenth Embodiment

Figure 22:
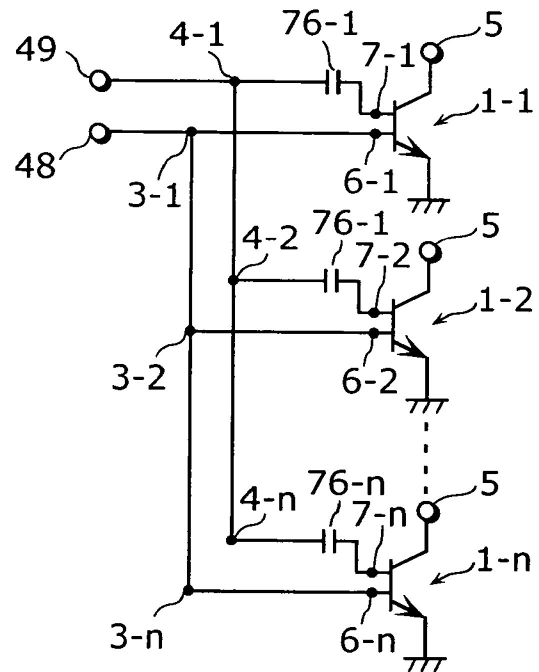
FIG. 22 is a circuit diagram showing a radio frequency amplifier circuit using the bipolar transistor shown in FIGS. 7A and 7B, according to a tenth embodiment of the present invention.

FIG. 22 is a circuit diagram showing a radio frequency amplifier circuit using the bipolar transistor 1 according to the first embodiment. The difference between the present circuit shown in FIG. 22 and the radio frequency amplifier circuit shown in FIG. 21 according to the ninth embodiment is that the resistance 77 is omitted. The respective bipolar transistors 1-1 through 1-*n* according to the present embodiment internally has a resistance whose resistance value can be freely set owing to its original structure, and provides by itself the effect of preventing thermal runaway owing to the negative feedback of Vbe. Consequently, it is possible, even without the resistance 77, to suppress thermal runaway as in the case of the radio frequency amplifier circuit shown in FIG. 21. Also, with the present circuit, it is possible to suppress thermal runaway as well as to realize simplification of the circuit layout and a low cost of radio frequency amplifier circuit due to the reduction in the chip area, compared to the radio frequency amplifier circuit according to the ninth embodiment.

Eleventh Embodiment

Figure 23:
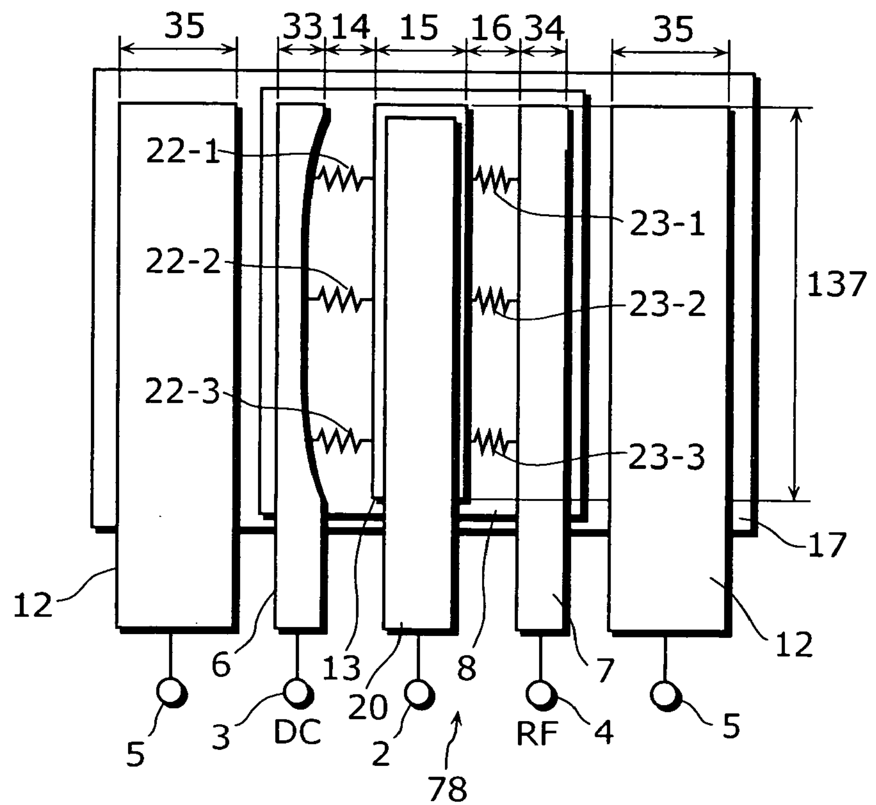
FIG. 23 is a plane view showing a structure of a bipolar transistor in a radio frequency amplifier circuit according to an eleventh embodiment of the present invention.

FIG. 23 is a plane view showing a structure of a bipolar transistor 78 according to the present embodiment. The difference between the plane view of the bipolar transistor 78 and that of the bipolar transistor 1 shown in FIG. 7B according to the first embodiment is that surface patterns are different between the DC base electrode 6 and the RF base electrode 7. That is to say that the former has a lacking portion in the part where the DC base electrode 6 is located adjacent to the emitter electrode 13, and that respective distances 14 between the DC base electrode 6 and the emitter layer 11 is not uniquely the same. In other words, the distance 14 gets longer in the center in the length direction of the finger portion and gets shorter at the edges. In such case, among the resistances 22-1 through 22-3 of the base layer 8, which are located between the DC base electrode 6 and the emitter electrode 13 in a distributed-constant-like manner, a resistance value of the resistance 22-2 in the center becomes larger while resistance values of the resistances 22-1 and 22-3 become smaller. Thus, it is possible to have a large amount of the negative feedback voltage of Vbe in the center of the bipolar transistor where over heating easily occurs. The radio frequency does not pass between the DC base electrode 6 and the emitter electrode 13; therefore, the radio frequency characteristic is not affected in spite of an uneven distribution of the resistances 22-1 through 22-3.

Note that the form of the DC base electrode 6 is not limited to the example described in the present embodiment, only the resistance value of the resistance 22 is required to be uneven in terms of distributed constant in order to produce the above-mentioned effects. In the case of the general radio frequency bipolar transistor, the RF base electrode 7 is designed in a rectangular form so that the resistances 23-1 through 23-*n* between the emitter electrode 13 and the RF base electrode 7 through which radio frequency passes are evenly distributed. In the case of the bipolar transistor 78 of the present embodiment, however, there is no need to form the DC base electrode 6 in a rectangular form for the reason as described above, and by forming the DC base electrode 6 and the RF base electrode 7 in different forms, it is possible to optimally design the negative feedback of Vbe within the bipolar transistor without degrading the radio frequency characteristic, and thus produces the effect of preventing thermal runaway.

Twelfth Embodiment

Figure 24:
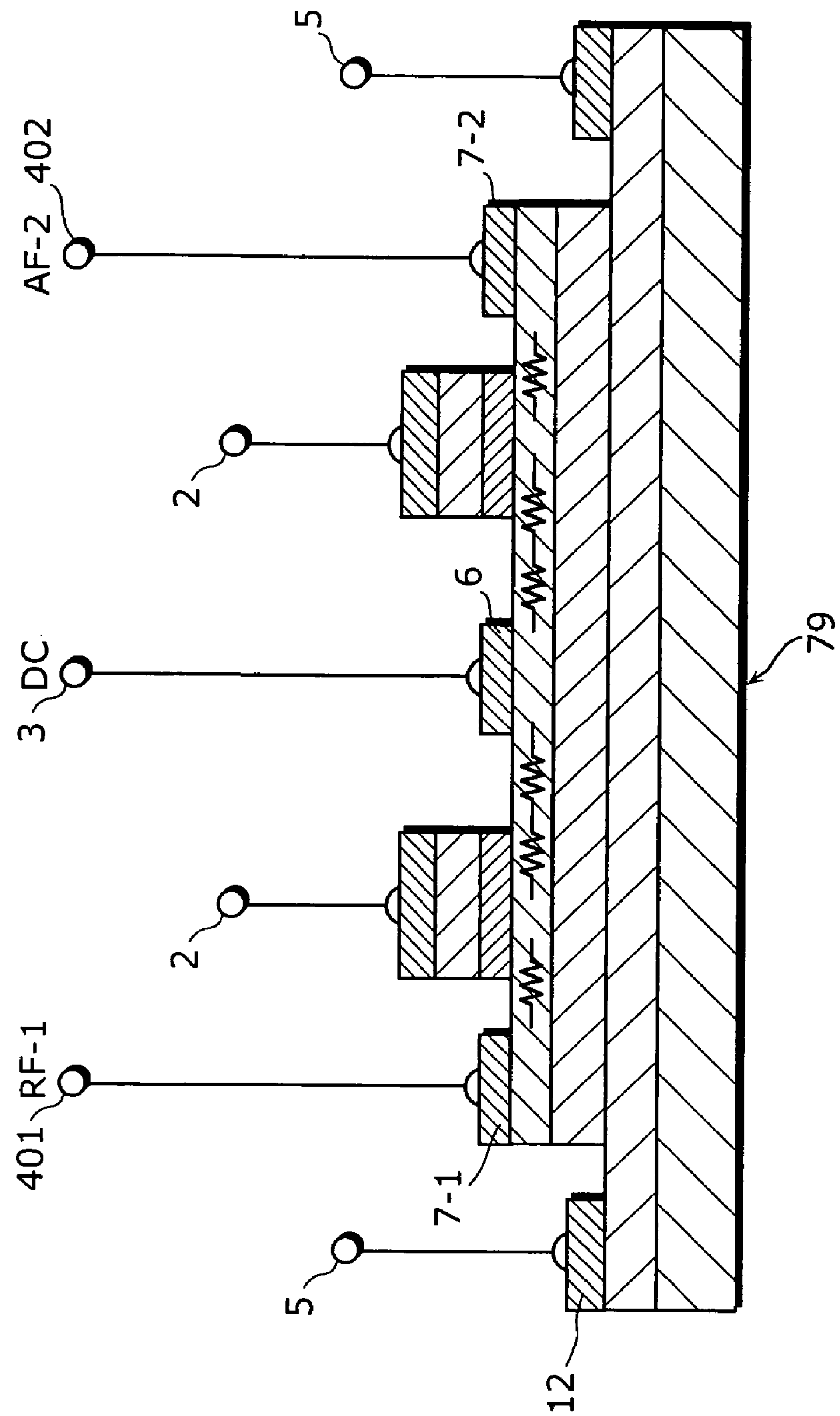
FIG. 24 is a cross-sectional view showing a structure of a bipolar transistor in a radio frequency amplifier circuit according to a twelfth embodiment of the present invention.

FIG. 24 is a cross-sectional view showing a structure of a bipolar transistor 79 in the radio frequency amplifier circuit according to the twelfth embodiment. The difference between the present bipolar transistor 79 and the bipolar transistor 71 shown in FIG. 15 according to the fourth embodiment, is that the former has plural RF terminals 401 and 402 and RF base electrodes 7-1 and 7-2 which are connected to the RF terminals 401 and 402, and that different radio frequency signals RF1 and RF2 are inputted from the RF terminals 401 and 402 into the RF base electrodes 7-1 and 7-2. The DC base electrode 6 is separated from the RF base electrodes 7-1 and 7-2 for the RF signals of two types so that the two different RF signals can be sufficiently separated as radio frequencies. Note that the RF1 and RF2 are the examples of a first radio frequency signal and a second radio frequency signal of the present invention, and the RF terminals 401 and 402 are the examples of a second terminal and a third terminal of the present invention, whereas the RF base electrodes 7-1 and 7-2 are the examples of a second base electrode and a third base electrode of the present invention.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention can be used as a radio frequency bipolar transistor and a radio frequency amplifier circuit, and is especially useful as a wireless communication terminal such as a cell phone.

What is claimed is:

1. A radio frequency amplifier circuit comprising:

a first terminal;

a second terminal;

a first base electrode connected to said first terminal;

a second base electrode connected to said second terminal;

a base layer connected to said first base electrode and said second base electrode;

an emitter electrode located between said first base electrode and said second base electrode;

a third terminal;

a third base electrode connected to said third terminal and said base layer; and a collector electrode, wherein:

said first base electrode is configured to receive a direct-current bias, said second base electrode is configured to receive a radio frequency signal, the direct-current bias and the radio frequency signal are separately applied to said base layer and then synthesized in said base layer, said emitter electrode is grounded, said collector electrode is configured to output an amplified radio frequency signal, said first base electrode and said second base electrode are directly in contact with said base layer, a direct-current bias is supplied to said first terminal, a first radio frequency signal is supplied to said second terminal, a second radio frequency signal different from the first radio frequency signal is supplied to said third terminal, and the direct-current bias, the first radio frequency signal and the second radio frequency signal are synthesized in said base layer.

2. A bipolar transistor comprising:

a first base electrode to which a first signal is supplied;

a second base electrode to which a second signal is supplied;

a third base electrode to which a third signal is supplied;

a base layer connected to said first base electrode, said second base electrode, and said third base electrode, wherein said first base electrode, said second base electrode, and said third base electrode are connected electrically only via said base layer;

an emitter electrode located between said first base electrode and said second base electrode; and a collector electrode, wherein:

said first base electrode is configured to receive a direct-current bias as the first signal, said second base electrode is configured to receive a first radio frequency signal as the second signal, said third base electrode is configure to receive a second radio frequency signal as the third signal, the second radio frequency signal being different from the first radio frequency signal supplied to said second base electrode, the direct-current bias, the first radio frequency signal and the second radio frequency signal are separately applied to said base layer and then synthesized in said base layer, said emitter electrode is grounded, said collector electrode is configured to output an amplified radio frequency signal, and said first base electrode and said second base electrode are directly in contact with said base layer.

3. A radio frequency amplifier circuit comprising:

a first terminal;

a second terminal; and a plurality of bipolar transistor cells, each of said bipolar transistor cells including:

a first base electrode connected to said first terminal;

a second base electrode connected to said second terminal;

a base layer connected to said first base electrode and said second base electrode; and only one emitter electrode located between said first base electrode and said second base electrode, wherein:

said plurality of bipolar transistor cells are connected in parallel, said first base electrode is configured to receive a direct-current bias, said second base electrode is configured to receive a radio frequency signal, the direct-current bias and the radio frequency signal are separately applied to said base layer and then synthesized in said base layer, said emitter electrode is grounded, each of said bipolar transistor cells is configured to output an amplified radio frequency signal, said first base electrode and said second base electrode are directly in contact with said base layer, said radio frequency amplifier circuit further comprises a capacitative element connected in series between said second terminal and second base electrodes of said bipolar transistor cells, and each second base electrode of said bipolar transistor cells is connected in common to said capacitative element.

4. The radio frequency amplifier circuit according to claim 3, wherein, during an operation of said radio frequency amplifier circuit, a direct-current potential of each said second base electrode is lower than a direct-current potential of each said first base electrode.

5. The radio frequency amplifier circuit according to claim 1, further comprising a resistive element connected in series between said first terminal and said first base electrode.

* * * * *